United States Patent [19]

Stewart

[11] Patent Number: 5,315,232
[45] Date of Patent: May 24, 1994

[54] ELECTRIC FIELD MEASURING SYSTEM

[76] Inventor: Michael F. Stewart, 1617 W. Second Ave., Durango, Colo. 81301

[21] Appl. No.: 637,307

[22] Filed: Jan. 3, 1991

[51] Int. Cl.$^5$ .................. G01R 29/12; G01R 31/02
[52] U.S. Cl. ..................................... 324/72; 324/457
[58] Field of Search .................. 324/72, 457, 458; 340/601, 660

[56] References Cited

U.S. PATENT DOCUMENTS

| | | |
|---|---|---|
| 1,919,215 | 7/1933 | Gunn . |
| 2,449,068 | 9/1948 | Gunn . |
| 2,587,156 | 2/1952 | Havenhill et al. .............. 324/72 |
| 2,815,483 | 12/1957 | Kaufman . |
| 2,820,947 | 1/1958 | Gunn . |
| 3,344,344 | 9/1967 | Wales . |
| 3,370,225 | 2/1968 | Winder . |
| 3,449,668 | 6/1969 | Blackwell et al. . |
| 3,519,927 | 7/1970 | Holt . |
| 3,727,125 | 4/1973 | Mourier .......................... 324/72 |
| 3,820,095 | 6/1974 | Wojtasinski et al. . |
| 3,824,454 | 7/1974 | Stern et al. . |
| 3,846,700 | 11/1974 | Sasaki et al. ................... 324/72 |
| 3,868,074 | 2/1975 | Hill . |
| 3,916,305 | 10/1975 | Few . |
| 3,917,996 | 11/1975 | Wagner et al. . |
| 3,919,636 | 11/1975 | Few . |
| 3,925,726 | 12/1975 | Few . |
| 3,935,532 | 1/1976 | Shuey et al. . |
| 4,054,835 | 10/1977 | Los et al. . |
| 4,095,221 | 6/1978 | Slocum . |
| 4,101,825 | 7/1978 | Truax . |
| 4,199,715 | 4/1980 | Hill . |
| 4,277,745 | 7/1981 | Deno . |
| 4,330,749 | 5/1982 | Eda et al. ....................... 324/457 |
| 4,370,616 | 1/1983 | Williams . |
| 4,422,037 | 12/1983 | Coleman . |
| 4,424,481 | 1/1984 | Larouche et al. ............. 324/457 |
| 4,433,297 | 2/1984 | Buchheit . |
| 4,506,211 | 3/1985 | Coleman . |
| 4,553,099 | 11/1985 | Kasahara et al. . |
| 4,642,559 | 2/1987 | Slough . |
| 4,672,305 | 6/1987 | Coleman . |
| 4,683,436 | 7/1987 | Suzuki ............................ 324/72 |
| 4,803,421 | 2/1989 | Ostrander . |
| 4,818,945 | 4/1989 | Bossard . |
| 4,875,133 | 10/1989 | Kawamura . |

FOREIGN PATENT DOCUMENTS

| | | |
|---|---|---|
| 0018372 | 2/1977 | Japan ............................. 324/458 |
| 0147068 | 9/1982 | Japan ............................. 324/72 |
| 1291128 | 11/1989 | Japan . |
| 0673938 | 7/1979 | U.S.S.R. ........................ 324/457 |
| 0966626 | 11/1982 | U.S.S.R. ........................ 324/72 |

OTHER PUBLICATIONS

An Electrostatic Fluxmeter of Short Response-time, Malan & Schonland, Proc. Phys. Soc. Lond., Jan. 1950, B 63, pp. 402–408.

(List continued on next page.)

Primary Examiner—Maura K. Regan
Attorney, Agent, or Firm—Kenton L. Freudenberg; Maxwell C. Freudenberg

[57] ABSTRACT

A system for measuring and recording DC electric field data at multiple locations using field mill sensors having periodically exposed sensing electrodes to provide cyclic signals, relating to the field amplitude and polarity, which are demodulated by phase synchronous detection to provide measurement of the field at an indicator which is calibrated and checked by intermittently applying to a rotor electrode a DC voltage determine calibration data for sensor indicators. Phase and frequency adjusting circuits control sensor motor/rotor speed and the signals generated for optimum polarity and amplitude measurement. Motor speed is controlled to minimize effects of external noise. Contamination degradation of sense electrode insulators is measured by comparing output signals as the rotor is changed between rotating and stopped conditions. Metal modulator parts are finished with extremely smooth polished surfaces. A central computer communicates with all remote sensors to record data and to monitor and control system operation and to provide appropriate alarms related to electric field intensities and to the operating condition of the sensors.

43 Claims, 23 Drawing Sheets

OTHER PUBLICATIONS

Point Discharge Currents from a Captive Balloon, Chalmers & Mapleson, J. Atmosph. Terr. Phys., Dec. 1955, V. 6, pp. 149–159.

Short-period Variations in the Atmospheric Electrical Potential Gradient, Whitlock & Chalmers, Q. J. Roy. Meteorological Soc., Mar. 1956, vol. 82, No. 353, pp. 325–336.

Two Electrostatic Field–Meters, A. S. Cross British Journal of Applied Physics, vol. 4 (Mar. 1953), Supp. 2, S47–50.

H. Lueder, Meteorologische Zeitschrift v. 60, Oct. 1943, 340–351.

C. T. R. Wilson, Cambridge Philosophical Society Proceedings, vol. 13, (Oct. 1905/06) 184–189, (Apr. 1905/06) 363–382.

C. T. R. Wilson, Royal Society of London Proceedings, (A) 80, (Mar. 1908), 537–547, (A) 92, (Jun. 1916), 555–574.

C. T. R. Wilson, Philosophical Transactions of Royal Society of London, (A) 221 (May 1920) 73–74.

Mapleson et al. Journal of Atmospheric and Terrestrial Physics vol. 7 pp. 61–72 Dec. 1955.

Rust et al. Instruments and Techniques for Thunderstorm Observation and Analysis Mar. 1989.

|  | MILL #1 | MILL #2 | MILL #3 | MILL #N |
|---|---|---|---|---|
| SENSOR STATUS | NORMAL | FAIL | DIAGNOSTICS |  |
| ELECTRIC FIELD VALUE | +30,000 | -4 |  |  |
| WARNING THRESHOLD | +2000 | +2000 |  |  |
| ZERO FIELD ERROR | +10 | -22 |  |  |
| GAIN ERROR % | +1.2 | -0.5 |  |  |
| CONTAMINATION ERROR | 1 | 200 |  |  |
| TIME SYNCHRONIZATION | OK | FAIL |  |  |
| AC POWER STATUS | OK | FAIL |  |  |
| AC PROTECTOR | OK | FAIL |  |  |
| BATTERY VOLTAGE | 13.8 | 11.9 |  |  |
| MOTOR SPEED | 84 | 85 | 0 |  |
| MOTOR POWER | 12.1 | 13.3 | 0 |  |

| COMMAND WINDOW: | TIME OF DAY: 13:02:25<br>DATE: 15 JUNE 91<br>TAPE REMAINING: 28 HOURS<br>MODE: PLAYBACK |
|---|---|

FIG. 9

ELECTRIC FIELD MEASURING SYSTEM

BACKGROUND OF THE INVENTION

The present invention relates to an electric field measuring system used primarily for measuring electric fields in the atmosphere in outdoor environments, but the features are likely to find application in other applications where the measurement and study of low frequency electric fields is desired. This invention is intended to improve the sensitivity and accuracy of electric field measurement and improve the use of computer equipment to perform a greater variety of management, maintenance, equipment and environment warnings and achieve improved design of field sensing components. Throughout this specification there will be reference to an overall system of several separately located sensors. The term sensor is used to refer to a complete hardware device and circuitry therefor for one sensing location which is often referred to as a field mill or field meter. Reference herein to sensing head is directed principally to the arrangement of plural cooperating electrodes which directly interface with the lines of force of the electric field. Because the fields are essentially DC fields, the sensing head typically embodies a mechanical modulating device and the sensor embodies demodulation to provide an output signal indicating both amplitude and sign of the field being measured.

SUMMARY OF THE INVENTION

The principal components of an electric field measurement system of the present invention consists of:
1. A plurality of dispersed environmentally-hardened, microcomputer-controlled digital electric field sensors;
2. A base station host computer with real time software for data acquisition, display, distribution and archive operation to measure electric fields and monitor and control operation of the dispersed system components;
3. Twisted pair data communication lines for asynchronous, full duplex communication between each sensor and the base station, and 120 VAC power at each sensor location.

The central data acquisition and control host computer provides the means to receive, record and display the acquired electric field data. The system utilizes an Intel 80386SX/ISA bus machine or suitable alternative as the host computer. The base station host computer is configured around a basic machine consisting of CPU, system memory, floppy disk drive, keyboard, and video display for displaying real-time measurements from all sensors. This basic configuration is augmented with:
1. 4 to 8 asynchronous serial I/O ports with modems to communicate with the remote electric field sensors,
2. A time code translator providing the means of synchronizing electric field data acquisition at the base station from multiple sensors with a precision of $+/-1$ millisecond,
3. A tape drive with controller providing sufficiently large formatted capacity for archiving electric field data,
4. A digital-to-analog converter providing an analog output port to drive a strip chart recorder.

The base station computer system software will allow receiving, displaying and recording of electric field data from multiple remote sensors. The status of the remote sensors will be continuously monitored so that problems or error conditions can be detected and alerts issued to an operator. The software will also allow commands to be issued to the remote sensors to request and verify sensor calibration and to instigate sensor self-checking procedures. Proper formatting of recorded data will be verified by tape read-back and display software facilities.

The base computer will utilize a text-oriented video display. The electric field sensors and base station computer will be able to reliably communicate via conventional modems over 19 to 22 gauge twisted pair telephone quality cables. The sensors and base station computer will operate with 120 VAC, 60 Hz power.

The electric field sensor at each field measuring location can be deemed as the integration of three parts performing distinct functions:
1) The electric field modulator which detects an external electric field by means of a grounded rotor in front of fixed sensing plates.
2) The electronic signal processing and control circuitry which transforms the detected field signal into numerical information for digital communication and computer assimilation.
3) The structures for housing and supporting the modulator and signal processing circuitry to insure accurate field measurement and long term operation.

The electric field sensors are low power, precision instruments that offer sustained accuracy of measurement of the electric field at the earth's surface with continuous, long-term, low-maintenance operation in a hostile seacoast or other environment.

The electric field measuring sensors of the present invention embody inventive features providing:
1. Precise calibration of the output field measurements;
2. Simplified phase adjustment of the modulator rotor using a single-pulse rotor position locating device;
3. Demodulation by phase synchronous detection;
4. Control of rotor speed to improve s/n ratio;
5. Improved life due to environmentally hardening modulator components to reduce corrosion of parts and sensing means to measure contamination-caused resistance changes and provide an alarm when contamination degradation or failure of certain operating parts is threatening optimum performance of the system thereby facilitating defensive or preventative maintenance;
6. An electric field sensor system that combines precision of measurement with environmental hardening using low cost components having configurations and features which simplify precision assembly of the parts in a system providing accurate real-time computer-based data acquisition and distribution.

The sensor electronics incorporates the means to accurately measure, digitize and transmit via an asynchronous serial line the magnitude and polarity of the surface electric field at the sensor location. Precision self-calibration circuitry utilizing a true end-to-end calibration technique provides assurance of sustained electric field measurement accuracy. The electric field measurement bandwidth is 0 to 10 Hz, with digitization occurring at 50 samples/second. Electric field sampling is synchronized across the sensor network and with respect to an time code signal at the base station to within 1 millisecond.

A microcomputer subsystem embedded in the circuitry of each remote sensor provides intelligent control of the data acquisition processes and allows the sensor to report internally detected faults and respond to remotely issued commands to self-check and self-calibrate. Operating software for the microcomputer is contained in an EPROM device.

A strobe warning light mounted on top of an electronics enclosure will give a visual indication of the existence of hazardous storm conditions based on a preset electric field level adjustable at the sensor. An audible warning device is fitted to signal the onset or end of hazardous electric field conditions.

An analog output port at the sensor allows the analog electric field signal to be locally monitored. An optional second serial port allows local control of the sensor with local data acquisition via a portable computer. This feature permits full sensor operation independent of the central host base station and communication lines and facilitates local testing and calibration without interfering with the operation of the rest of the measurement network.

Sensor location is a critical factor in the successful installation and operation of the electric field measurement system. However, the configuration of the present electric field sensor is such that minimal site preparation will be required. The sensors are self-supporting and can be stabilized and secured with footings or a pad.

The electric field sensor relies on the physical movement of a grounded shield to modulate the exposure of stationary sense electrode plates to an external electric field in order to detect a DC electric field. The resulting variable exposure induces charge flow on and off the sense plates which is detected as the charge flows through an electrical impedance connecting the plates to ground. The charge flow is characterized by an amplitude which is proportional to the external field, and a spectral content related to both the frequency with which the plate exposure occurs and the geometry of the sense plates and moving shield.

Field measuring devices that detect the charge flow by a resistive impedance actually measure the derivative of the field signal, or current, which has the disadvantage of having an amplitude proportional to the frequency of modulation. The present invention avoids this frequency sensitivity problem by utilizing charge amplifiers, which produce a charge to voltage conversion by forcing the plate charge to be supplied by a capacitor tied to an operational amplifier virtual ground.

The present invention demodulates the charge signal by employing phase synchronous detection, with circuitry based on lock-in amplifier techniques. This method requires that the detected charge signal be both frequency and phase coherent with a reference signal derived from the moving shield and is fundamental to achieving the required dynamic range and noise rejection. The stable narrow band response is far superior to techniques that rely on peak or envelope detection or gated integration for demodulation.

The action of the modulator is to multiply the external electric field by the modulator frequency, thus shifting the field signal up in frequency, and the action of the phase synchronous detector is to multiply that frequency-shifted signal by the modulator frequency again to shift it back down.

A key feature of phase synchronous detection is that signal amplification can occur away from the relatively high level of noise near zero hertz (DC drift, 1/f noise). Since the 1/f noise corner frequency of electronic amplifiers occurs in the range of 10 to 100 Hz, an optimized detector will modulate and amplify signals above this range. The present configuration utilizes a modulation frequency of 85 Hz and performs all signal amplification before demodulation.

Since it is not possible to band limit the electric field signals that the modulator is exposed to, it is important to know the instrument's frequency response. Amplitude modulation and phase synchronous demodulation of the electric field signal will exhibit "transmission windows" of response at harmonics of the modulation frequency due to three types of aliasing.

First, if the area modulation of the sense plates is not purely sinusoidal, aliasing of signals occurring at harmonics of the modulation fundamental can occur due to mixing with the higher order Fourier components in the modulation waveform. The strength of these aliased signals will depend on the magnitude of the modulation harmonics. The present modulator will exhibit an area modulation waveform with reduced spectral content and simple sense plate shapes.

Similarly, if the reference signal used to demodulate (re-multiply) the field signal has Fourier components, transmission windows will again occur at harmonics of the modulation fundamental. Phase synchronous detectors with the greatest accuracy, dynamic range, and stability rely on square wave reference signals to synchronously rectify the modulated signal. The resulting odd harmonics in the reference waveform will allow aliasing of external signals occurring at even harmonics of the modulation fundamental to occur. In this case, relative sensitivity is inversely proportional to odd harmonic number.

The approach adopted for the present invention is to utilize a modulation frequency (85 Hz) that places these even harmonic "transmission windows" (first window at 170 Hz) away from major anticipated interference frequencies such as 60 cycle power and harmonics. It is also significant to note that for higher modulation frequencies, fewer transmission windows will exist in a given bandwidth, implying higher noise rejection.

A third avenue for aliasing can occur if the amplitude modulation of external signals is less than 100%. If any part of a sense plate is continuously exposed to external fields, the resulting unmodulated coupling will give rise to transmission windows at odd harmonics of the modulation fundamental. The present modulator minimizes common mode coupling.

While the main purpose of a "differential" modulator employing two sets of sense plates is to maximize available sensing area for a given modulator diameter, harmonic response to unmodulated signals equally coupled to both phases of sense plates can be reduced by the combination of matched phase gains, accurate phase subtraction, and balanced demodulation. These characteristics are incorporated in the present configuration.

Instrument response to the air-earth current is also considered in this configuration. The air-earth current is modulated in much the same way as the electric field by an electric field sensor, and as such represents a potential source of error. For the present invention, the charge amplifier's response to current acts like a low pass filter with a breakpoint considerably below the modulation frequency of the current. This effectively eliminates sensor response to air-earth current flux as high as 100 picoamperes per square meter.

A principal object of the invention is to achieve improved accuracy in the measurement of low strength electric field with equipment that has a long continuous operation field life.

Another object of the invention is to provide a simpler sensing head in which the electrode parts are less likely to be improperly positioned during assembly.

Another object is to achieve longer life of the head components which are exposed to the weather or other hostile environment.

It is an object of the present to provide improved means to calibrate an electric field measuring device.

A further object of the invention is to improve the demodulation of signals from an electric field modulator and minimize the effect on field measurements of noise signals. Other objects will be apparent from the foregoing introductory description and the following detailed descriptions.

DESCRIPTION OF THE DRAWINGS

FIG. 9 is a chart representing the display on a video terminal at a base station computer or on a portable computer at a sensor site to indicate the status of several parameters of operation of a plurality of remote electric field sensors, including sensed electric field voltages, power and control signals and voltages, safety conditions, data recordation and factors which may be used for automatic triggering of alarms by the computer or by circuitry at a remote sensor.

FIG. 24 relates to calibration of the preferred embodiment of FIG. 1 and FIGS. 25 and 26 relate to alternative embodiments wherein a calibrating voltage is applied to a stationary non-removable electrode.

The sense electrode means of FIGS. 29-30 are located relative to both the shield and shutter electrode means to provide a first set of areas which are exposable electrode ares uniformly spaced circumferentially around said axis for sensing charges from the electric field. The shutter or rotor electrode means has a second set of areas which are open areas alternating around its axis with modulating or field intercepting electrode portions thereof to alternately expose and cover sensing areas of the first set. The areas of one of the first and second sets, at the time of maximum exposure of the respective sense electrode areas, being each circular and the areas of the other of the first and second sets at such time of maximum exposure extending between lines extending radially from the rotor axis on opposite sides of respective circular sensing areas and extending radially perpendicular to said axis and parallel to the plane of the coplanar sensing areas.

Figure 1:
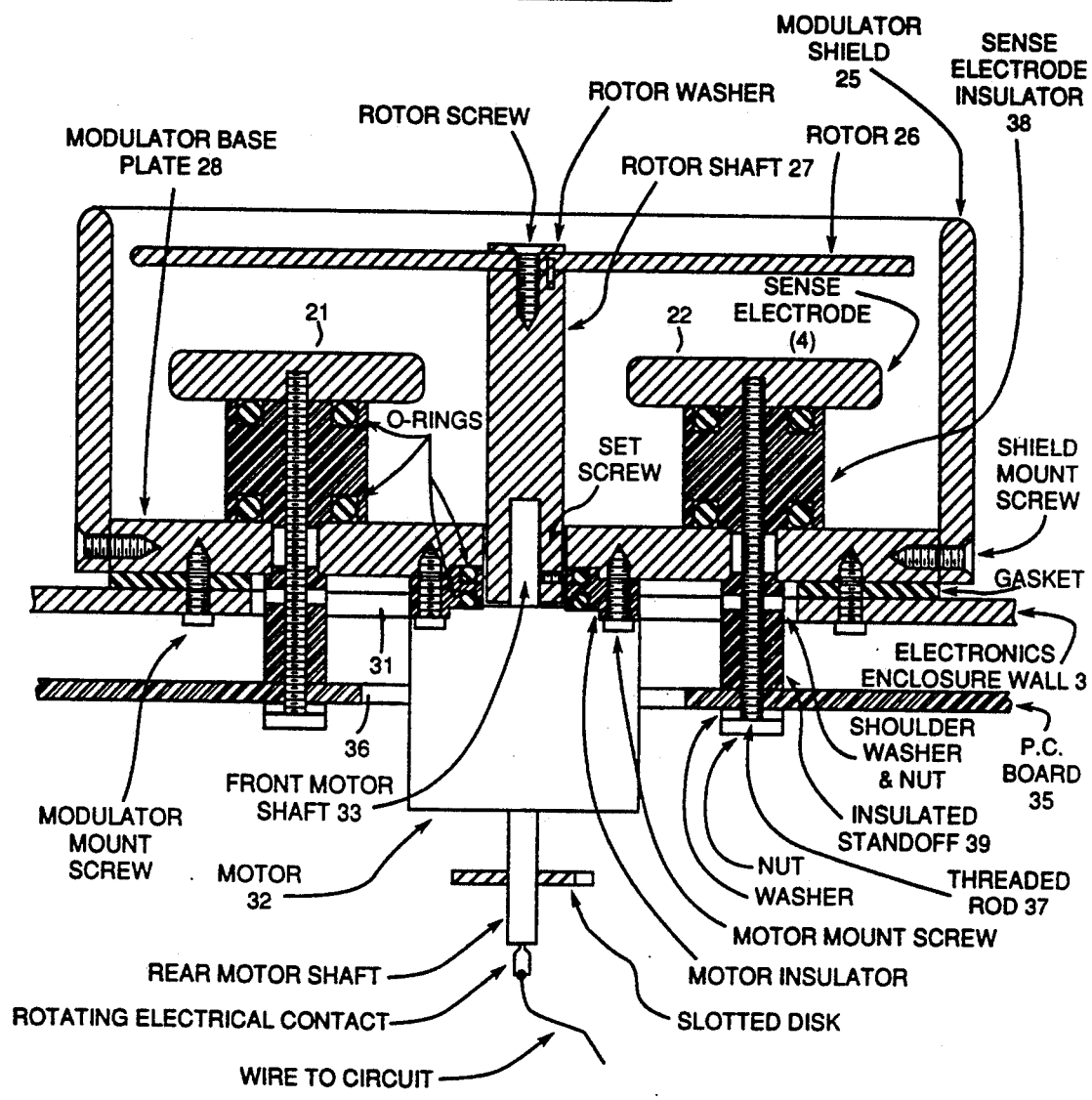
FIG. 1 is a cross section of a portion of an electric field sensor head structure of the preferred embodiment showing details of a modulator.
Figure 31:
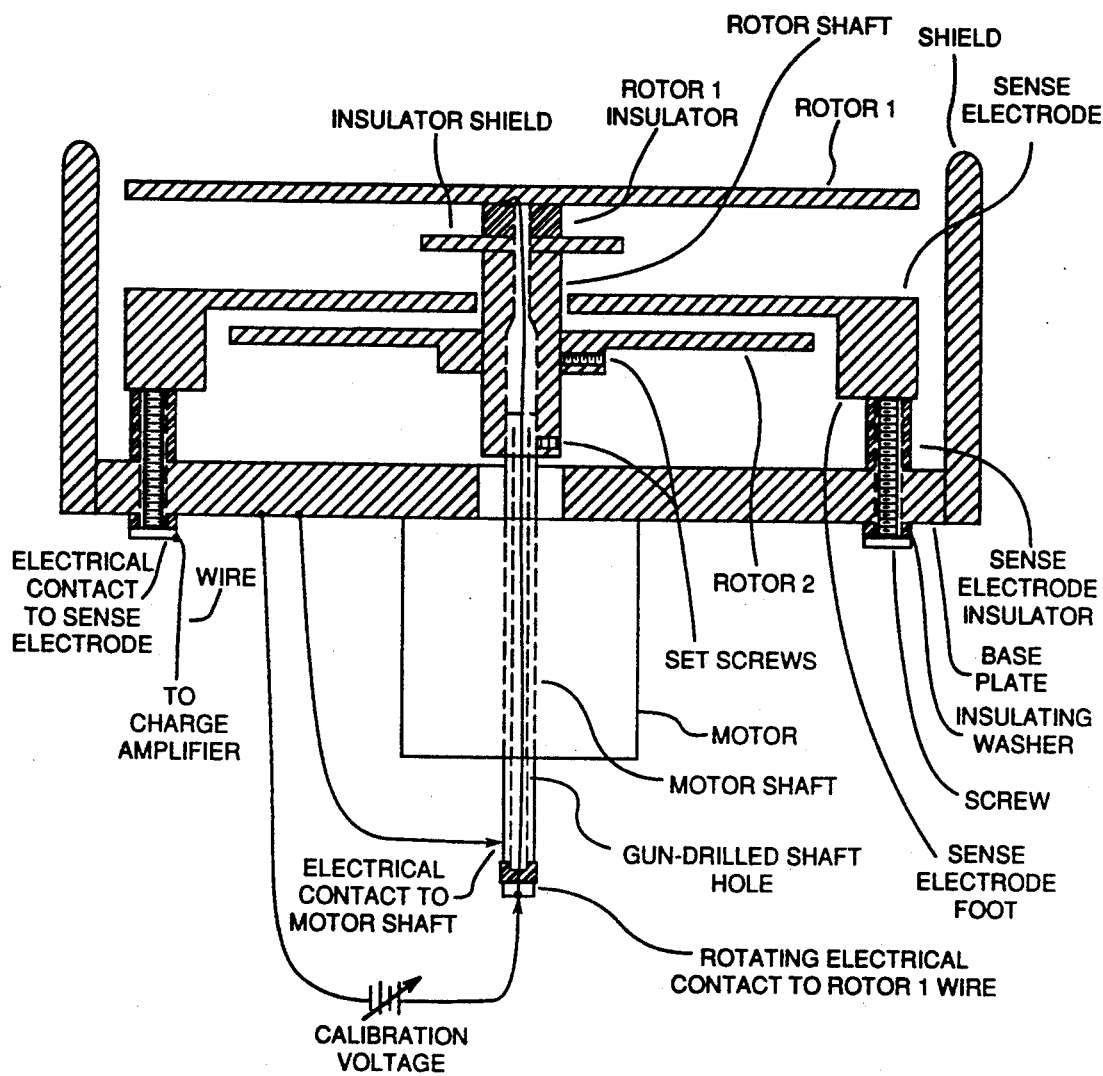

FIG. 31 is a cross section similar to FIG. 1 illustrating an alternative embodiment of a modulator showing an isolated bow-tie rotor above four-sector sense electrode with an electric conductor passing through the rotor shaft to ground the rotor for normal field measurement or to otherwise apply test, calibration or other voltages thereto, and a grounded second bow-tie rotor below the sense electrodes and arranged 90 degrees from the other rotor.

Figure 2:
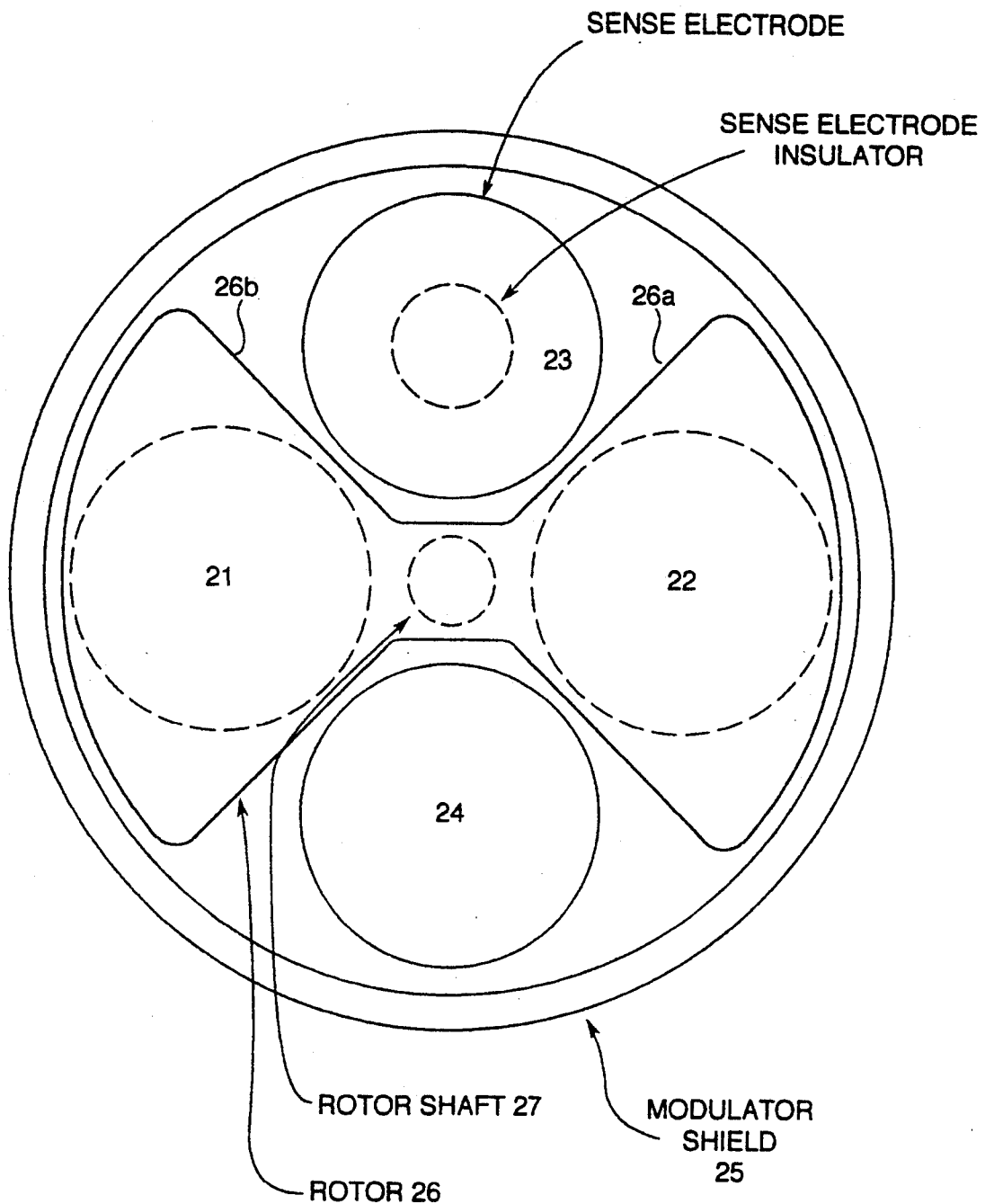
FIG. 2 is a view of the exposed end of the modulator of FIG. 1.
Figure 3:
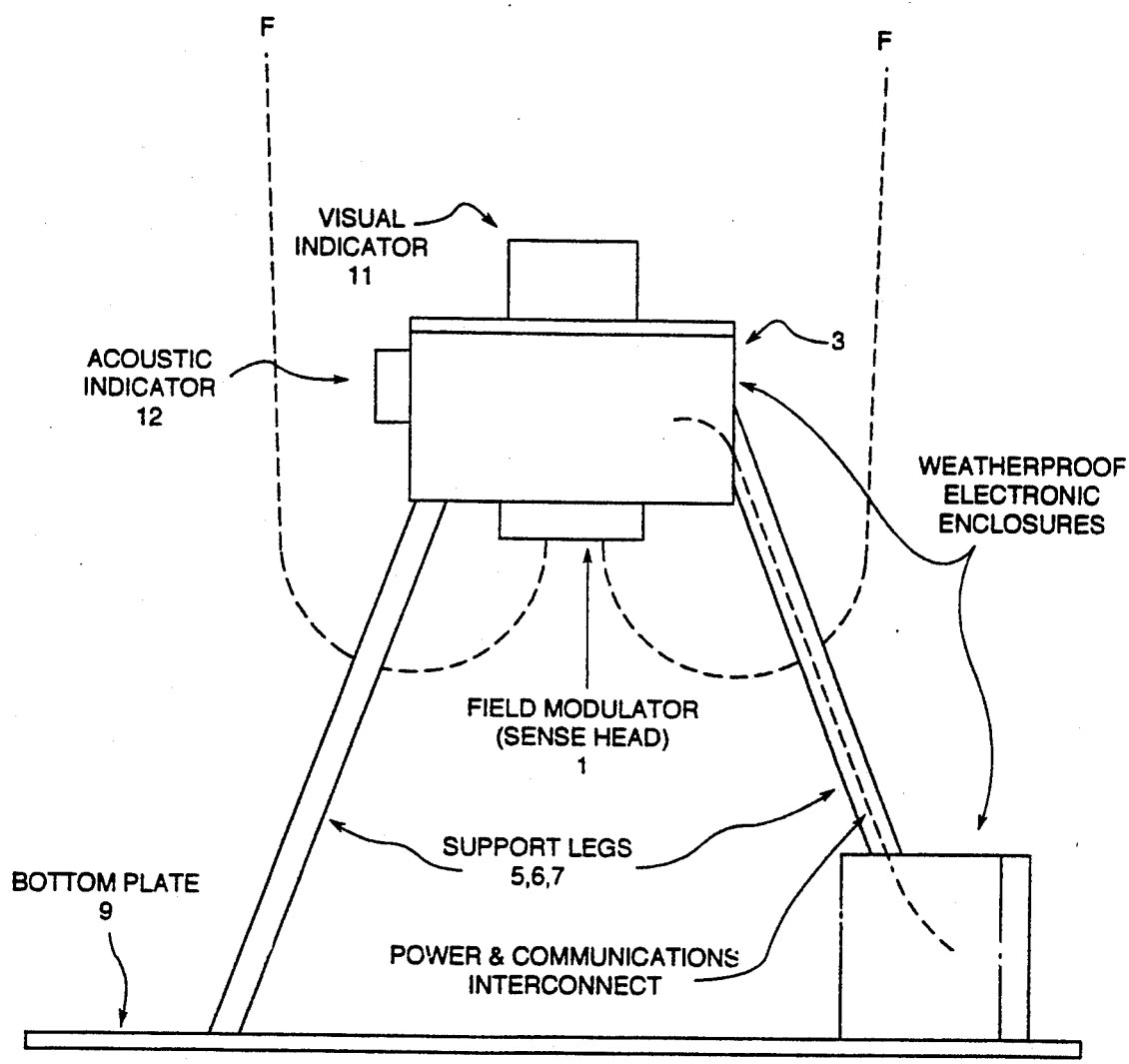
FIG. 3 is a side view of an electric field sensor of the preferred embodiment showing the mounting of the modulator of FIG. 1 on the underside of an electronics enclosure which is supported by three legs above a base plate which typically rests on the ground during use.
Figure 4:
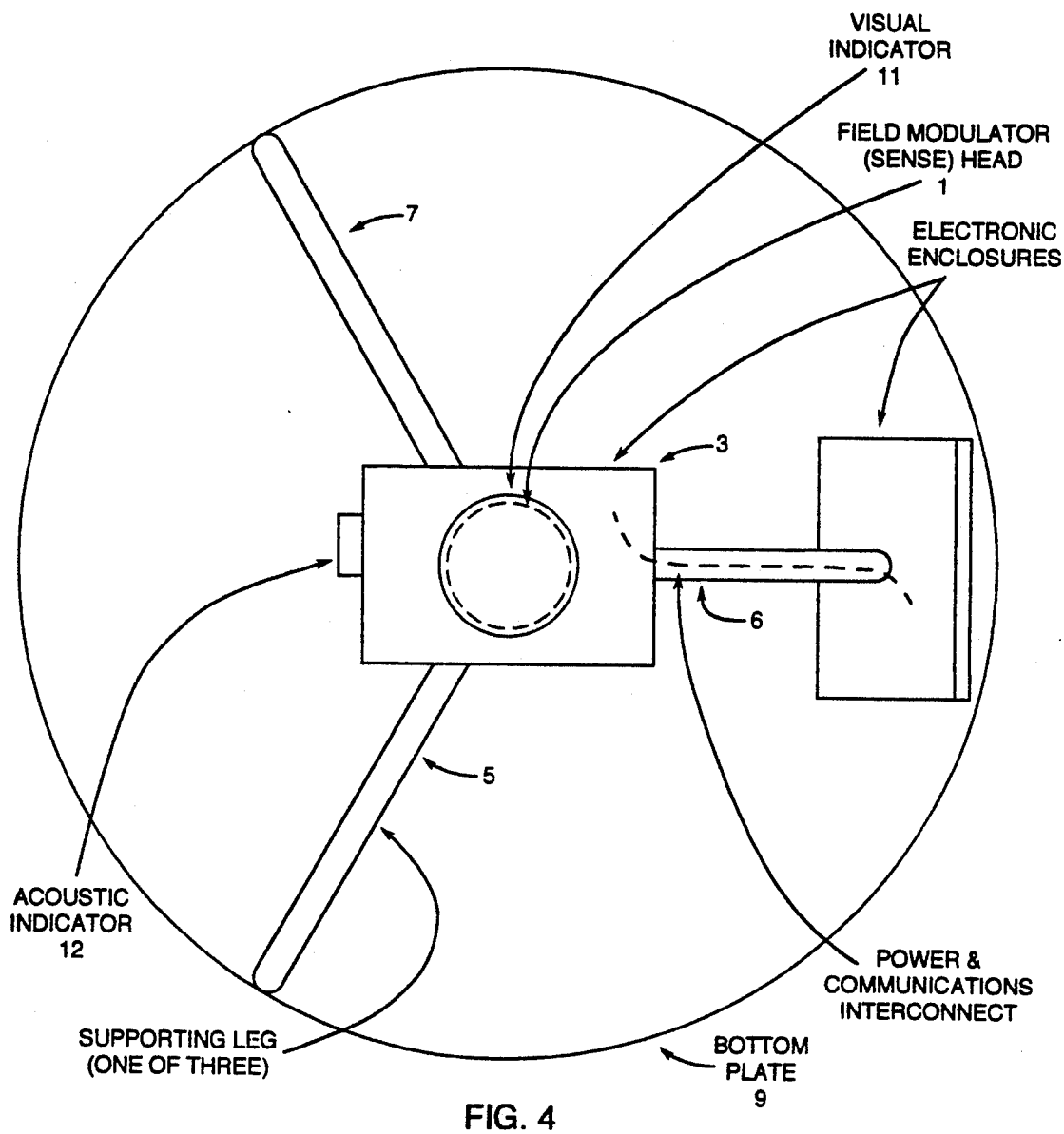
FIG. 4 is a top view of the sensor of FIG. 3.
Figure 32A:
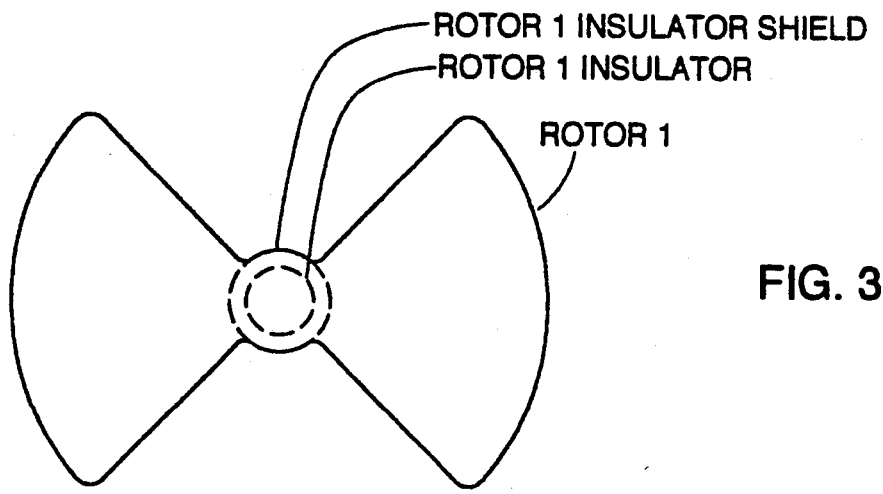
Figure 32B:
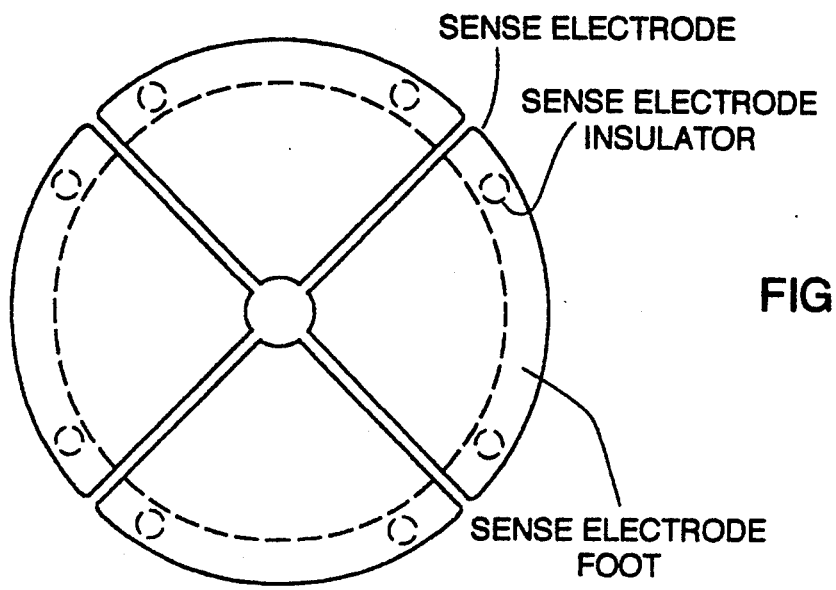
Figure 32C:
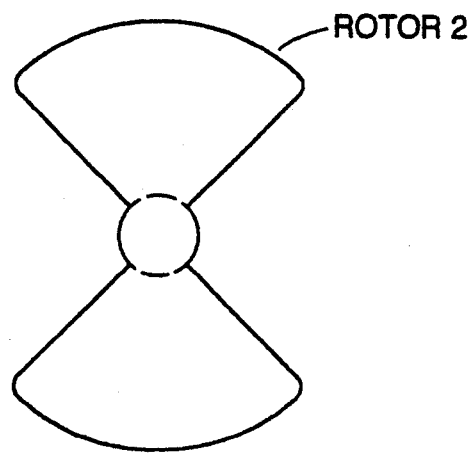

FIGS. 32a, 32b and 32c are views of separate electrodes of the modulator of FIG. 31 as they would be seen in an end view similar to FIG. 2.

Figure 33:
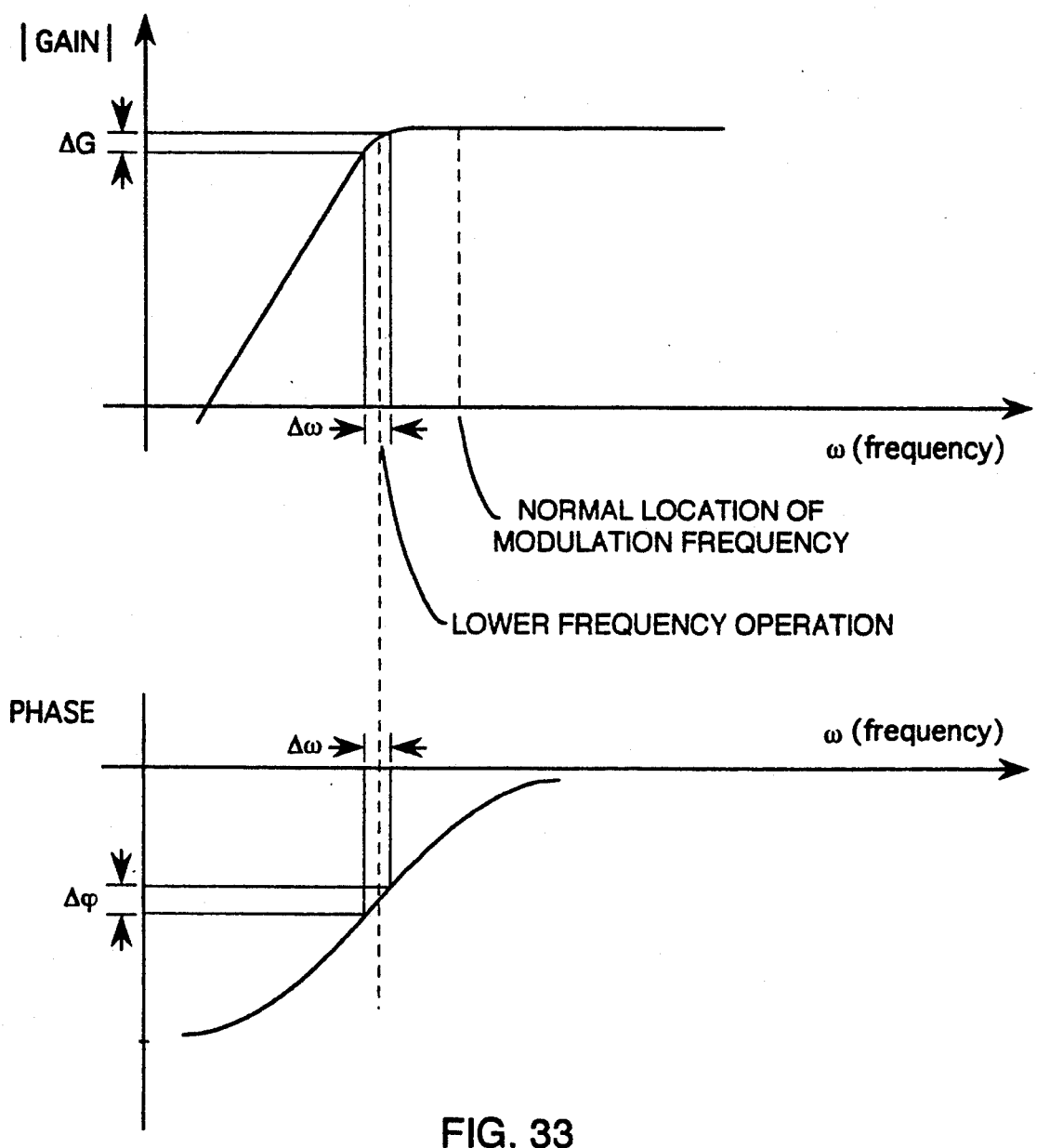

FIG. 33 illustrates the gain and phase response of the charge amplifier in the context of operating the sense head at a lower than normal frequency.

DESCRIPTION OF THE PREFERRED EMBODIMENT

Figure 5:
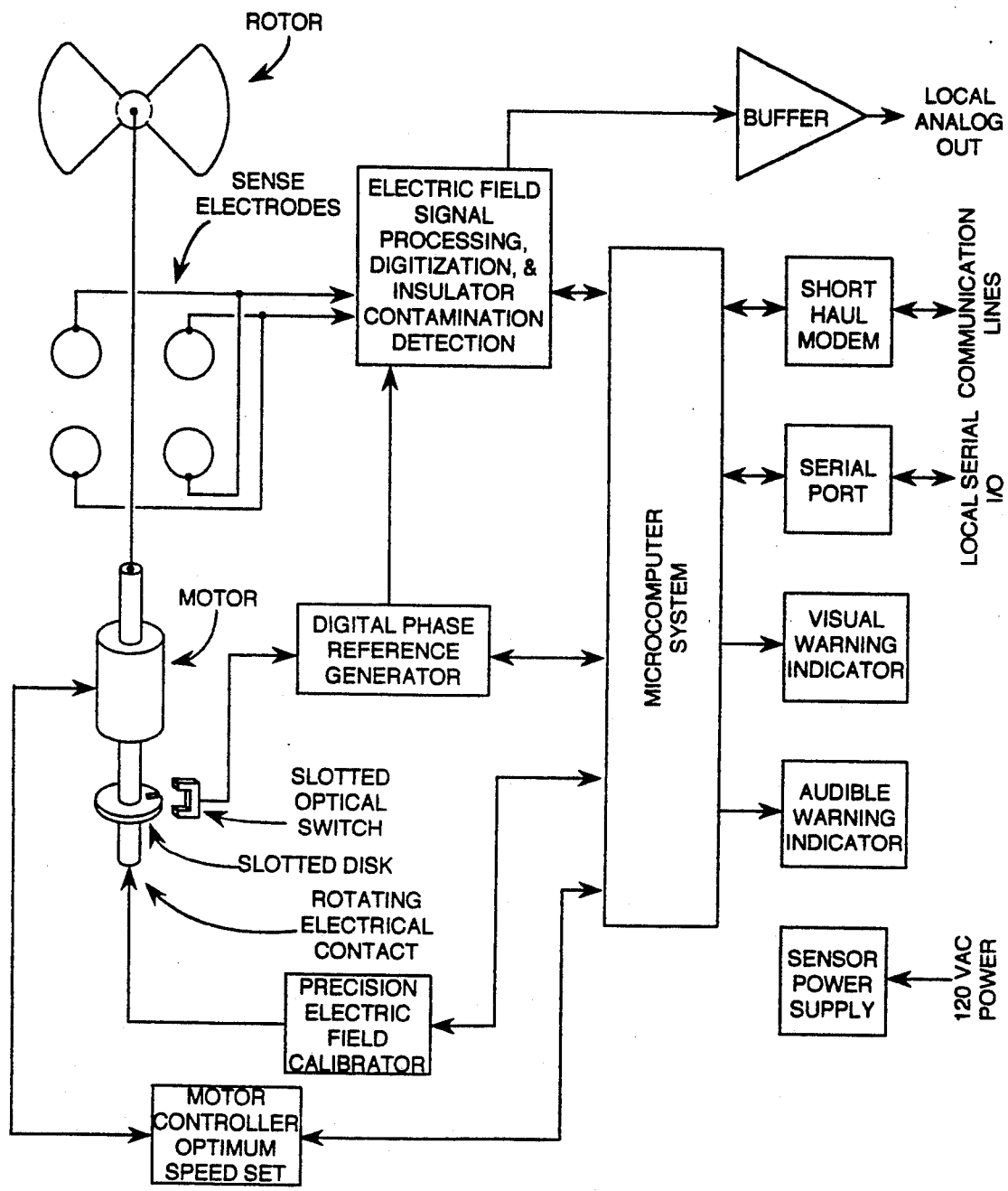
FIG. 5 is a block diagram of some of the principal electronic circuitry of the electric field sensor of the preferred embodiment.

The preferred embodiment of the present invention is embodied in hardware components as seen in FIGS. 1-4 and electronic circuitry shown generally in block diagrammatic form in FIG. 5, but in greater detail in FIGS. 6-9. Although the most significant hardware features of the invention are in the modulating and sensing parts of a modulator head 1 shown in detail in FIGS. 1-2, description of its relationship to the environment where electric fields are being measured will be described by first referring to FIGS. 3-4.

The modulator head 1 is inverted from the position of FIG. 1 and suspended at the under side of a weatherproof electronics enclosure 3 with sensing parts therein conventionally facing downwardly to measure the electric field which is represented by the field lines F which extend down and around the electronics enclosure and up into the head 1.

The electronics enclosure 3 houses all of the electronics described hereinafter which are needed for operation of the measuring system at a remote site. The enclosure 3 is supported with the head about 2 to 4 feet above the ground by means of a structure including three downwardly divergent 2" dia. tubular legs 5, 6 and 7 of a tripod. The upper ends of the legs are secured to the enclosure 3 and the lower ends are secured and grounded to a ⅛" thick circular base plate 9. A small interconnect box is located between the lower end of leg 6 and the plate 9 for making external power and communication connections which extend up through leg 6 and into the electronics enclosure. The enclosure 3 and the support structure are coated with a weather and water resistant marine grade white paint to minimize corrosion. The structure may be free standing or bolted to suitable anchors at sites where the wind is severe.

Alarm devices in the form of a strobe warning light 11 on or atop the enclosure 3 and an acoustical warning device 12 also on the enclosure 3 are provided for purposes described in detail hereinafter. The interconnect box may be made large enough to contain a battery to provide portable or emergency backup power.

Referring to FIGS. 1-2, modulator portion of the preferred embodiment has four round or circular sensing electrode discs 21, 22, 23 and 24 of 1.825 inch diameter symmetrically located around the center axis of a cylindrical modulator shield 25 having a six inch outside diameter. The lines of force of the electric field which enter the sensor and pass to the sense electrode means comprising discs 21-24 are essentially confined, by means of the shield electrode 25 encircling the sense electrode means 21-24, to paths which are intercepted by means of the shutter rotor electrode 26. The upper or outwardly facing surface of the electrodes 21-24 are coplanar in a plane perpendicular to the axis of shield 25 and are spaced about 0.315 inch from the under surface of a rotating bow-tie shaped rotor electrode 26 having flat upper and lower faces each parallel to the coplanar upper faces of electrodes 21-24. The rotor has outer vanes 26a and 26b which as seen in the position of FIG. 2 covers the pair of sensing electrodes 21-22 and exposes the pair of sensing electrodes 23-24. Rotation of the rotor electrode 26 causes the outer vanes 26a and 26b to progressively cover and uncover the respective pairs of sensing electrodes. The straight edges of vanes 26a and 26b lie on crossed perpendicular lines through the rotor axis. This effectively modulates the charge collected on the sensing plates from the spacial area in which the electric field F is being measured in a manner and for a purpose to be more fully explained hereinafter.

The rotor 26 is part of a rotor assembly which includes a rotor shaft 27 concentric with the modulator shield 25. The plate-like rotor 26 is secured to the outer flat end of the rotor shaft by a keying pin, a rotor washer and a screw clamping the washer against the outer surface of the rotor plate 26. A heavy circular modulator base plate 28 is secured in sealed relationship to the wall of enclosure 3 over a circular hole or aperture 31 in the wall of the enclosure 3. The lower portion of the shield 25 fits closely around the base plate 28 and is detachably secured to plate 28 by four equally circumferentially spaced screws. The plate 28 and shield 25 form a well within which the rotor and sense electrodes are located. The shield 25 is 1.65 inches high and the base plate 28 is 0.375 inches thick. The mounting of the rotor 26 provides a spacing of 0.315 inches between the rotor and the plane of the sensing surfaces of sense plates 21-24. The shield is readily removable to facilitate inspection and cleaning of modulator components within the well. All of the parts 21 through 28 described above and located within the sensing area within the modulator shield are made from 316 stainless steel and have an extremely smooth mirror-like finish to reduce surface contamination on these parts as will be described in more detail hereinafter. Production of space charge in the vicinity of the modulator due to corona discharge from sharp or pointed edges could produce serious error in field measurement that would be difficult to detect. The circular sense plates are fabricated from 0.312" thick plate and have 0.125" peripheral radiused top and bottom edges to prevent corona discharge under full scale field conditions. Since the field will be significantly stronger at the modulator shield edge, the shield is fabricated from 0.250" wall tubing to provide a large radius of 0.125" at its exposed peripheral edge. The bow-tie rotor 26 has an outer diameter of 5.28", is made from 0.100" sheet material and is fully radiused at its entire periphery. All of these radii reduce corona and errors in field measurement.

Within the area of the hole 31 in the enclosure wall is a brushless electric motor 32 having an end supported by an insulating teflon or acetyl resin mounting plate screwed to the base plate 28 with the motor shaft 33 coaxial with the modulator shield 25 and extending through a center similarly coaxial hole or aperture in the base plate 28. The motor mounting plate is sealed with respect to both the plate 28 and the closed end of the motor by O-rings in annular grooves in the mounting plate. The rotor shaft 27 is mounted on the motor shaft 33 and secured thereto by a set screw.

At least a large or major part of the electronic circuits within the enclosure 3 are on a printed circuit (PC)

board 35 extending parallel to the wall of enclosure 3 on which the modulator 1 is mounted. The PC board 35 has an opening 36 through which the motor 32 extends. The PC board is supported indirectly from the enclosure wall on the base plate 28 by four threaded rods 37, each of which has one end screwed into a respective one of the sense electrodes 21-24. A washer and nut is tightened on the other end of each rod to clamp together as a rigid assembly on the base plate 28: the sense electrode, a cylindrical insulator 38 between the electrode and one side of base plate 28, a cylindrical standoff insulator 39 on the other side of plate 28 and the PC board 35. The washer and nut electrically connect each rod 37 and its respective sense electrode to appropriate conducting strips on the face of the PC board 35.

O-rings are utilized to seal the sense plate mounting apertures in the base plate, and the rings themselves are protected from atmospheric attack by the location of the o-ring glands in the sense plate insulator.

The electronics enclosure is watertight and the support legs, the interconnect box and the base plate will all be welded together and then painted with marine grade white paint.

The support legs are removed from the vicinity of the modulator to minimize field shielding and surface charge effects.

The power and communication wiring is routed inside one of the support legs to shield the wires and minimize interference with the field measurement.

Corrosion-proof electrical bonds are formed by welding the support elements together, providing a reliable low impedance path to earth should a direct lightning strike to the elevated housing be sustained. The symmetrical configuration facilitates earthing to multiple ground rods in locations with high earth resistivity.

The electric field mill support structure is self-supporting, allowing temporary deployment on any level surface. Sand bags can be used to temporarily stabilize the sensor. Permanent installation is made via a bolt tie-down to the base plate. Either a concrete pad or individual footings can provide a foundation.

The sensor should be earthed with at least one ground rod driven near the base plate. For locations with high earth resistance, two or three ground rods symmetrically placed around the base plate can provide multiple paths to ground in the event of a direct lightning strike.

Power and communication wiring connections can be made to the sensor in the terminal box at the base of one of the support legs. This box can be drilled to install strain-relief fittings or electrical conduit fittings.

Cleaning of the modulator is facilitated by easy removal of the modulator shield (4 screws) to allow access to the interior sense plates and insulators. The modulator and motor form an assembly which removes from its mounting on the electronics enclosure as unit. Removal of the electronics circuit boards from the enclosure will entail disconnecting a few cables and removing some screws: most if not all of the electronics will be implemented on one printed circuit board which is mounted to a removable aluminum plate.

The electric field modulator as seen in FIGS. 1-2 is configured as in a "shutter" type electric field sensor with fixed sensing plates alternately exposed and shielded from the earth's electric field by a normally earthed rotating cover. The configuration of, and the materials used in, the modulator are such that an optimum compromise between field sensitivity, measurement error, corrosion resistance, and cost is achieved.

The electrode means of the sensing head of the present modulator consists of four circular sensing electrode plates arranged in a circle, with a shielding rotor electrode with radial blades in front of them and a modulator shield electrode. The sensing plates are insulated from a supporting base plate by non-hygroscopic, non-piezoelectric "Kel-F" polychlorotrifluoroethylene (PCTFE) insulating standoffs. This assembly is surrounded by the modulator shield electrode which is attached to the base plate and extends slightly beyond the plane of the rotor.

Figure 10:
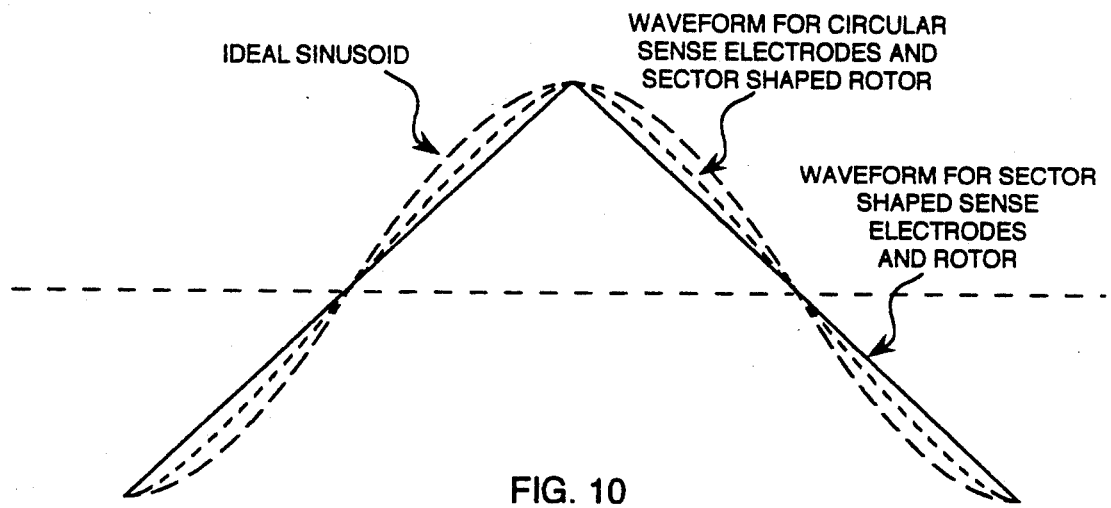
FIG. 10 is a representation of several actual or theoretical modulator output wave forms.

The rotor/sensing plate geometry of this invention will produce a charge modulation waveform that is more nearly sinusoidal than the conventional radial blade rotor and "sector of annulus" sensing plate shape. Calculated waveforms are presented for comparison in FIG. 10. Both will in practice exhibit rounding of crests and troughs due to field line fringing to the modulator shield and rotor, which implies a reduction in the amplitude of the higher order harmonics.

Given the noise floor achievable in the electronic detecting circuitry, a minimum modulator sensitivity, i.e., net sensing plate area, can be determined. The actual field sensitivity of the plates is reduced in a non-linear manner by the shielding effect of the rotor, its geometry and the depth of the well formed by the modulator shield. The present modulator has sufficient plate area (approx. 67 $cm^2$) to provide a signal well above the worst case noise floor under minimum field conditions, taking into account the field attenuation due to modulator "self-shielding" and support stand effects.

The limiting of the several circular sensing areas of the sense electrode means to a small number, as seen, for example, in FIGS. 2 and 27-30, enables the net sensing area of the coplanar sensing plates of the sense electrode means to be quite large relative to the internal diameter of the sensor shields. The movable shutter electrode means are each rotatable about an axis and parallel to said sensing areas for periodically varying the exposure of the large flat sensing plate areas of the sense electrode means to the electric field when the motor means connected to the shutter electrode means rotates the latter to cyclically move the shutter electrode means to vary said exposure.

The electric field sensing area at each electrode of the set of four sense electrodes 21-24 of FIG. 2 has a circular configuration when one of the set of two open areas of the rotor or shutter 26 is in registration with the respective sense electrode, this circular sensing area corresponding to the shape of the respective electrodes. Similarly for the embodiments or FIG. 29A-29C or FIG. 30A-30C, a circular sensing area is provided on the stationary annular sense electrode plate each time one of the sense apertures of the rotor is in registration with the sense apertures of the stationary shield/screen sense aperture therebelow. The exposed circular sensing areas occurring from the configurations of FIGS. 29A-29C and 30A-30C have diameters corresponding to the diameters of the respective circular sense apertures of FIGS. 29A and 30B thereabove. Each such circular sense area is located a distance from the rotor axis which is less than the diameter of the respective circular sensing area. Such an arrangement of locating the sensing areas close to the rotor axis provides, for example in FIG. 2, a large total area which is about 44 percent of the 67 sq. cm. area within the shield 25. Although the use of four apertures in the rotors of FIGS. 29 and 30 require a larger spacing between these apertures, as well as between the corresponding four sense apertures in the shield electrode means, the proximity of circular sensing areas to the rotor axis similarly enables benefits accruing from a large total sensing area. In the embodiments of FIGS. 2 and 30A the leading and trailing edges of field-intercepting portions of the bow-tie shutter or of the rotor with sector-of-annulus shaped sense apertures are along radially extending lines perpendicular to and through the rotor axis. Similarly the sides of the sector-of-annulus shaped apertures in the shield/screen electrode in FIG. 29B extend radially relative to the rotor axis. A pair of these radially extending edges lie at opposite sides of the circular sensing areas of FIGS. 29A or 30B when the two overlying sets of sensing apertures of the rotor and shield/screen electrodes are in registration.

"Self-shielding" is a term used to describe the measured decrease in modulator sensitivity from that calculated on the basis of sense plate area. Modulator sensitivity is measured with the modulator viewing the interior of a parallel plate test apparatus through a hole in one plate, with a uniform field between the plates produced by inducing a potential difference between the two plates. The present modulator will have a self-shielding factor of approx. 2.5, i.e., the measured sensitivity will be about 2.5 times less than total plate area would indicate.

It is expected that the field attenuation due to the inverted configuration and tripod support legs will be offset by the field enhancement due to the raised position above the ground to give a net field enhancement of about 0.4.

Zero-field measurement errors can arise in the modulator from two sources: 1. Contact difference of potentials between the modulator components; and, 2. Electrical charges residing on the surfaces of these components.

A signal indistinguishable from that produced by an external field is induced by rotor movement modulating the rotor/sense plate capacitance on which is imposed the contact potential. The present modulator utilizes type 316 stainless steel exclusively to minimize the magnitude and long-term drift of the contact potential and will incorporate a rotor/sense plate spacing to meet the required zero-field error for a worst case contact potential.

Electrical charges residing anywhere within the modulator that can induce a variable image charge on the rotor as it moves can also produce an apparent zero-field error. The present modulator configuration as seen in FIG. 1 hides the sense plate insulators from the rotor to eliminate this common source of error. "The cylindrical sense electrode insulators 38 support the sense electrodes 21-24 in substantially spaced relationship relative to the shutter rotor 26 and shield electrode 25, the insulating means 38 being effectively hidden from said shutter 26 so that errors in the quantitative indication of the strength of said electric field due to interaction between the shutter electrode and the insulators, resulting from their relative movement, are minimized."

Atmospheric contamination and intrusion of insects into the modulator can lead to surface charge errors. The present modulator minimizes insect intrusion by incorporating a tight clearance between the rotor and modulator shield. By extending the modulator shield slightly beyond the plane of the rotor, the influx of air contaminants into the modulator via air turbulence is reduced without a major increase in the modulator self-shielding.

Surface charge accumulation due to airborne contaminants cannot be eliminated in a modulator that must be exposed to the atmosphere, but routine cleaning and facilitating the completeness of that cleaning can reduce the impact of contamination on zero-field errors and corrosive destruction of modulator components. Visual verification of electrode cleaning is greatly facilitated by the use of mirror or highly reflective surfaces referred to below.

The type 316 stainless steel modulator components used in the present invention will have critical surfaces manufactured to a maximum 32 microinch surface roughness, followed by a chemical polishing procedure which reduces surface roughness by at least 50% to 12-16 microinches. Also suitable are surface finishes referred to as No. 7 and No. 8. These both have a high degree of reflectivity, No. 7 being referred to as a High Luster finish, but the No. 8 being referred to as a mirror finish is the most reflective of commonly produced finishes. It is obtained by polishing with successively finer abrasives and buffing extensively with very fine buffing rouges to provide a surface essentially free of grit lines from preliminary grinding operations. Mirror-like finishes can also be achieved by lapping processes to reach finishes as low as 2 to 4 microinches. Physical properties of type 316 or 316L CRES steel are more completely set forth in ASTM Specification A 240 and surface finishes are referred to in ASTM A 480 and ANSI/ASME B46.1 1985 relating to Surface Texture/Surface Hardness. These procedures result in smooth, easily cleaned surfaces which have reduced iron content and increased chromium content for improved rust resistance. Rust not only presents a surface charge problem, but results in pitted surfaces that require abrasive cleaning.

Exposure of type 304 CRES modulator components to a seacoast environment for 3 months without cleaning resulted in significant pitting. A similar exposure of type 316 CRES components resulted in only minor corrosion. Lab tests of salt-water exposed chemically polished type 316 CRES components showed no corrosion after 4 months.

No screw heads or fasteners are exposed to the rotor, as the accompanying surface irregularities would provide locations for contamination accumulation which would be difficult to clean.

Common Mode Rejection

The four sense plates are individually supported and insulated, but are alternately electrically connected to produce two "sets" of plates. This arrangement insures that no part of any set of plates is continuously exposed to external fields (and noise) as the rotor rotates. This results in 100% amplitude modulation of external fields and maximizes the common mode rejection of the modulator.

Figure 6:
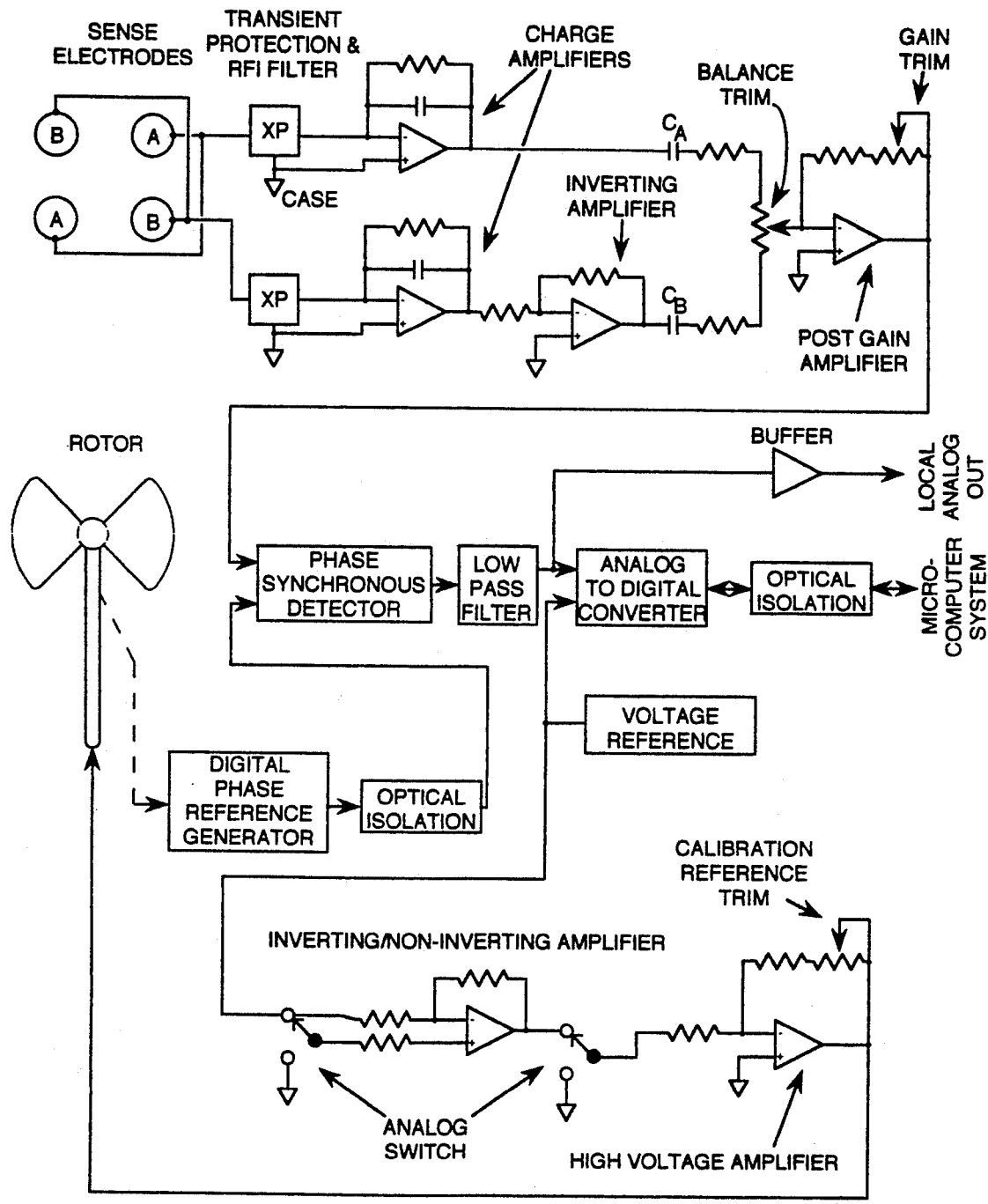
FIG. 6 is a partial schematic diagram of certain inventive features for the preferred embodiment used as a self-contained electric field sensor for installation remote from a base station.

Electronic Signal Processing and Control (FIG. 6)

Signal Detection

Electric field signal detection is accomplished with low noise charge amplifiers for each of the two sense plate phases. The out of phase signals from the two pairs of sense plates are added by inverting the output of one charge amp and applying this signal and the signal from the other charge amplifier to a summing amplifier. This summing amplifier will have a gain of about 6. It also has independent means to balance the signals from the two pairs of sense plate amplifiers and precisely trim overall sensor field sensitivity.

Input Transient Protection (FIG. 6)

Input transient protection is performed by low capacitance, 1500 Watt semiconductor Transorb zener diode voltage limiter at the charge amplifier inputs. The low capacitance is necessary to minimize charge amplifier noise gain. An interference filter is also required to attenuate interference that is higher in frequency than the charge amplifier's closed loop bandwidth. This noise would not be subject to linear processing and can rectify in the operational amplifier's input stage producing spurious DC outputs.

Charge Amplifier Considerations (FIG. 6)

The main characteristics of the charge amplifiers are:
1. Charge to voltage conversion inversely proportional to the feedback capacitance.
2. A high pass filter response due to the pole formed by the parallel combination of the feedback capacitor and resistor.
3. A frequency dependent noise gain dependent on the input and feedback impedances.

The feedback capacitor is chosen to achieve the required gain. For the anticipated net modulator field sensitivity, the feedback capacitor required would be smaller than desired based on the need to adequately minimize the effect of circuit input and stray capacitance on amplifier accuracy. Therefore, the value of the feedback capacitor is increased by the required amount with the summing amplifier making up the gain difference. The feedback capacitor will have a value of at least 100 pf and be an NPO ceramic type with 30 ppm/degC temperature coefficient.

The feedback resistor is then determined by the required error due to the low frequency roll-off. At the modulation frequency, the thermal noise of the typically high-megohm feedback resistor greatly exceeds amplifier voltage and current noise. The signal-to-noise ratio of the charge amplifier is decreased by deferring gain to later stages since the signal is decreased proportional to the gain deferred, but the noise of the feedback resistor only decreases in proportion to the square root of the amount of the gain deferred. However, with an adequately sized modulator, the signal-to-noise ratio can be made high enough to allow this deferred gain.

The signal-to-noise ratio of the front end can be increased if the feedback resistor could be decreased. The present configuration reduces the feedback resistor to a value that moves the low frequency pole of the charge amplifier closer to the modulation frequency than would be normally required to avoid attenuation and phase shift errors. The idea is to recognize that the frequency regulation of the closed-loop motor controller limits signal amplitude and phase variations. A modulation frequency regulation of 5% is sufficient to allow a factor of 4.4 decrease in feedback resistor value. This results in a signal-to-noise improvement of 6.4 dB.

FIG. 33 depicts variation in gain and phase shift that result when the field modulation frequency is moved down from a normally accepted frequency to the vicinity of the breakpoint in the high pass frequency response of the charge amplifier, and when the modulation frequency can vary by some small amount.

Contamination of the sense plate insulators leads to decreased insulator resistance. This can adversely affect sensor operation in three ways.

First, if the input impedance of the charge amplifier is significant compared to the insulator resistance, current can flow through the insulator, resulting in a gain error. The present configuration limits amplifier input resistance to 1 Kohm, which will result in a gain error of 0.3% for contaminated insulator resistance of 350 kohm.

Second, a decreased insulator resistance results in an increased charge amplifier DC noise gain. The charge amplifiers' input offset voltage is amplified by this noise gain, resulting in a DC error at the output. The present configuration capacitively couples the charge amplifier outputs to block this DC error. An insulator resistance of 350 kohm gives about 300 millivolts of DC error.

Third, the AC noise gain of the charge amplifier increases as the insulator resistance decreases. Only the amplifier voltage noise is increased by this noise gain, and the present configuration can tolerate a noise gain of 70 (corresponding to an insulator resistance of 350 kohm) at the modulation frequency before the output noise increases to the equivalent of 1 LSB.

The AC noise gain of the charge amplifier is also approximately proportional to the ratio of the input capacitance to the feedback capacitance. For this reason, the input filter capacitance is limited to a value equal to the feedback capacitance.

Figure 13:
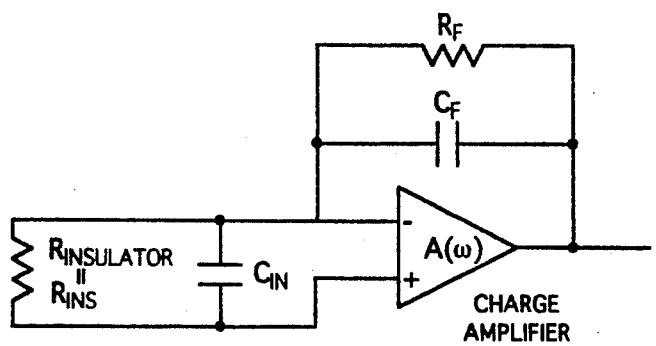
FIG. 13 is an electrical schematic of a charge amplifier circuit showing the important electrical impedances.
Figure 14:
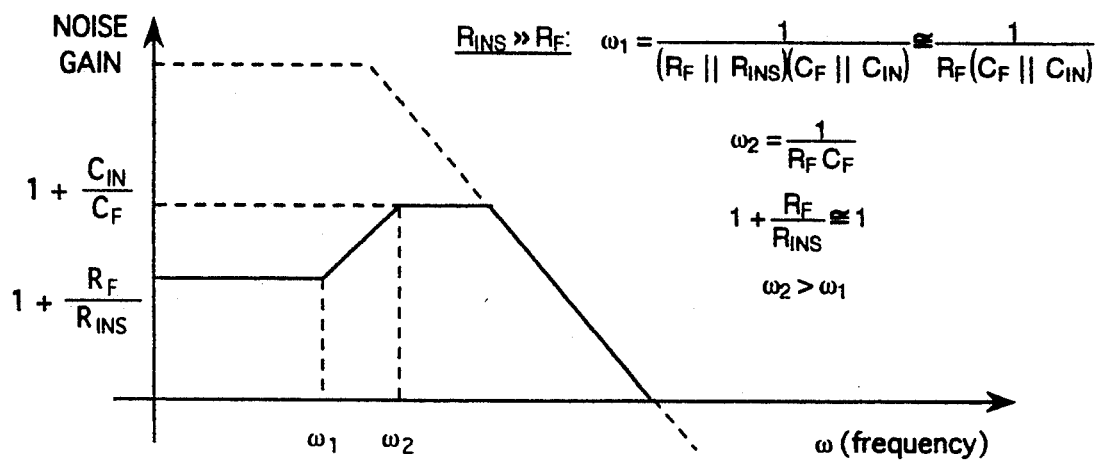
FIG. 14 and FIG. 15 depict the frequency dependent noise gain of the circuit of FIG. 13 for different relative values of the circuit impedances.
Figure 15:
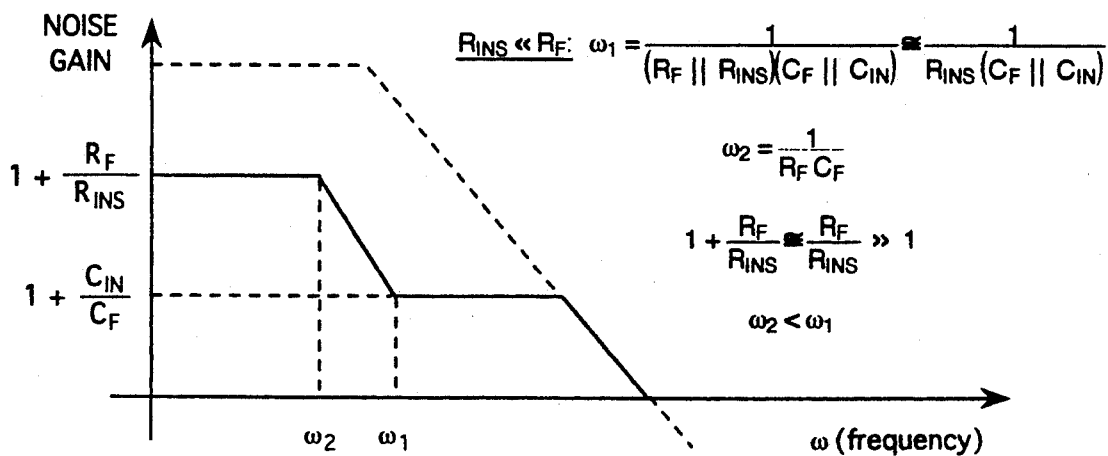

FIG. 13 depicts an electrical model of the significant components in the charge amplifier circuit. FIG. 14 illustrates the frequency dependent noise gain of a charge amplifier circuit when the sense electrode insulator resistance is much greater than the feedback resistor Rf, which is by far the dominant noise source in the circuit. FIG. 15 illustrates what happens to the noise gain when the insulator resistance becomes less than the feedback resistance due to environmental contamination.

By implementing means to measure the increase in noise gain due to the decrease of sense electrode insulator resistance, it is possible to remotely evaluate the degree of environmental contamination of the sense head. Key to this technique is the capability to remotely stop the spinning of the motor driving the rotor so as to decouple the charge amplifiers from the external electric field.

Figure 16:
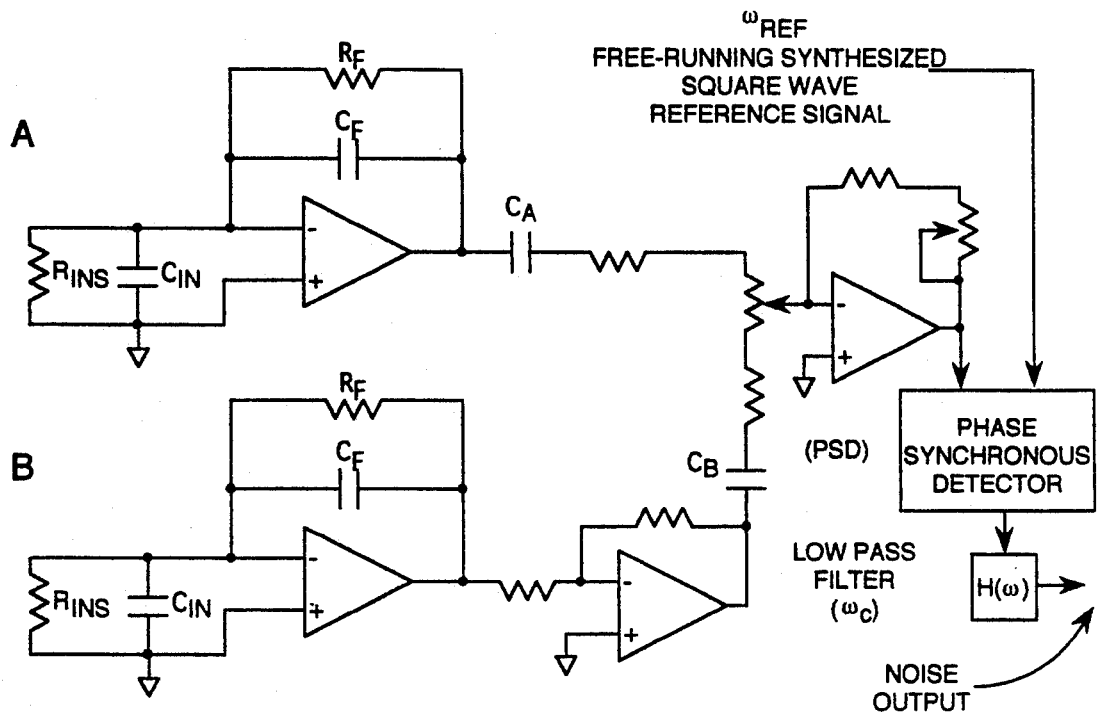
FIG. 16 illustrates the preferred circuit embodiment for measuring the increase of circuit noise gain due to environmental contamination of the sense head.

With a capacitively coupled summing amplifier configuration as in FIG. 16, the DC offset of the charge amplifiers is blocked. If the phase reference input of the Phase Synchronous Detector is connected to a free-running square wave signal instead of the reference signal derived from the rotor shaft movement as is normally the case, then the output of the circuit at the Low Pass Filter following the Phase Synchronous Detector will exhibit the frequency response depicted in FIG. 17. By selecting the frequency of the free-running square wave to be in the low frequency portion of FIG. 15, the sensitivity of the noise measurement can be maximized. A typical measurement would consist of evaluating the peak-to-peak amplitude of the noise as compared to system operation with a clean sensing head.

Figure 18:
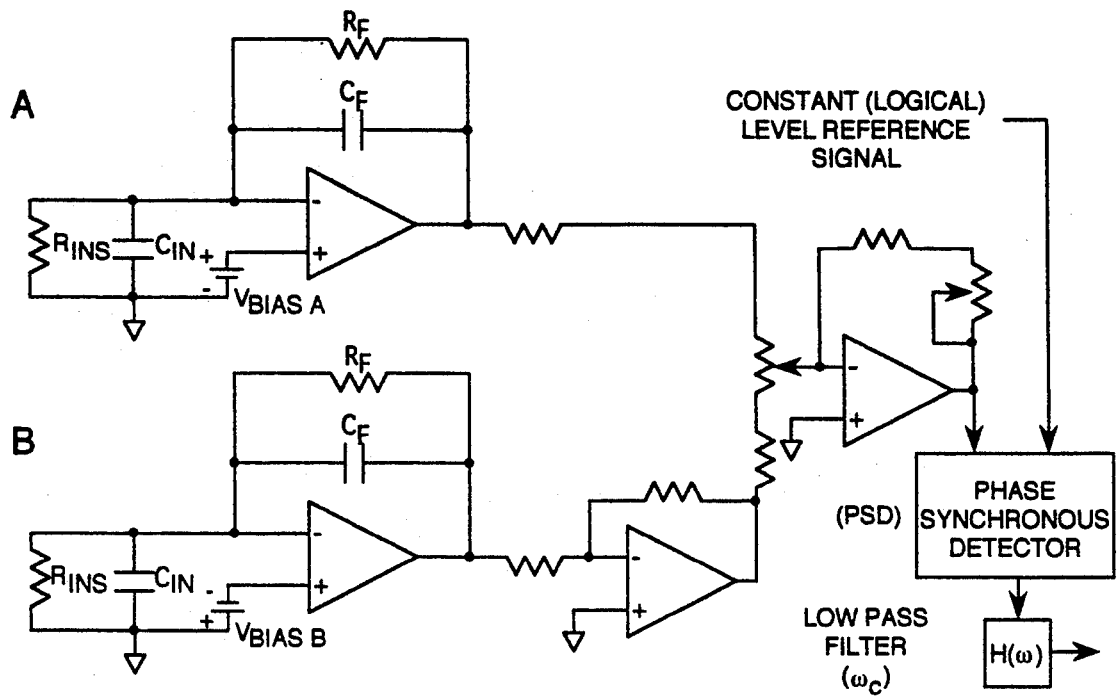
FIG. 18 illustrates another circuit embodiment for measuring the increase of circuit noise gain due to environmental contamination of the sense head.
Figure 19:
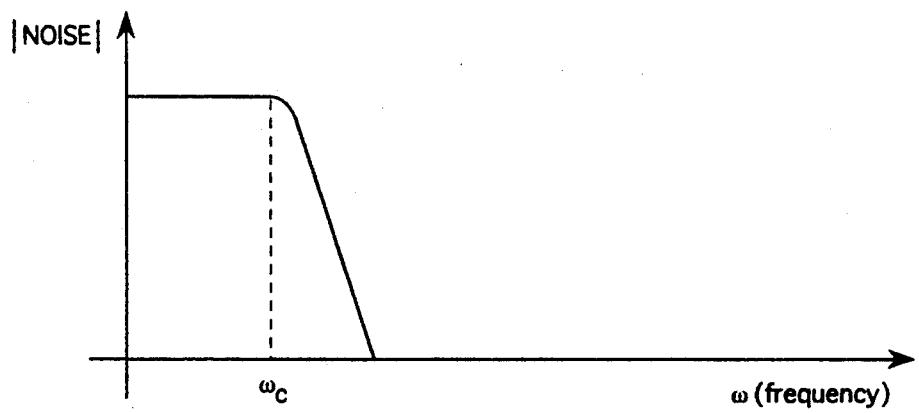
FIG. 19 describes the frequency response of the circuit of FIG. 18 in the noise gain measurement mode.

FIG. 18 depicts a DC coupled circuit configuration that also allows remote determination of insulator resistance by noise gain measurement with the rotor stopped. In addition to removing the blocking capacitors following the charge amplifiers, small DC offsets of opposite polarities are applied to the the charge amplifiers. This is done to overcome the internal DC offsets (over temperature) of the operational amplifiers used in the charge amplifier circuits. In this case, as the insulator resistances decrease, the outputs of the charge amplifiers will exhibit increasing DC levels of opposite polarity which will add at the input to the Phase Synchronous Detector. If the reference signal to the Phase Synchronous Detector is set to either a high or low constant level instead of being connected to the signal derived from the rotor shaft movement, the output of circuit at the Low Pass Filter will exhibit the frequency response depicted in FIG. 19. Therefore, a DC path will exist all the way from the charge amplifiers to the output of the Low Pass Filter, and it becomes a simple matter to measure this DC level.

Figure 17:
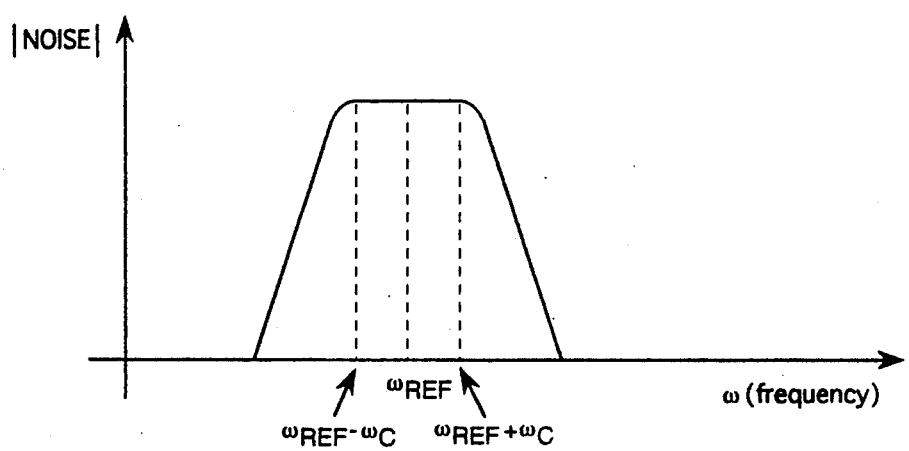
FIG. 17 describes the frequency response of the circuit of FIG. 16 in the noise gain measurement mode.

When the motor is restarted to drive the rotor and the reference signal to the Phase Synchronous Detector is switched back to the signal from the Digital Phase Reference Generator, the circuit of FIG. 18, will exhibit a frequency response similar to that shown in FIG. 17. Thus the DC error signals out of the charge amplifiers will be rejected so that normal field measurements can be made in the presence of insulator contamination. The degree of DC error rejection possible in this case is limited by the precision of the duty cycle of the square wave reference signal and the inter-channel balancing of the Phase Synchronous Detector.

Inverting Amplifier (FIG. 6)

A phase inversion in one sense plate pair amplification path is used to allow a single amplifier implementation of balance and gain trim. Stable unity inverting gain is easy to accomplish and phase shift at the modulation frequency is negligible.

Balance and Gain Trim Amplifier (FIG. 6)

Configured as an inverting summing amplifier with a gain of about 6, an input balance trim resistor network allows the gain of the two sense plate phases to be matched for optimum common mode rejection. A trim resistor in series with a larger gain set resistor in the feedback loop allows precise setting of overall sensor field sensitivity. The balance and gain adjustments are independent in this configuration.

Signal Demodulation (FIG. 6)

Demodulation is accomplished via a phase synchronous detector which gives the sensor lock-in amplifier performance. Phase and frequency coherent detection yields a stable bandpass frequency and phase characteristic that can be matched only by digital filtering. It is important to perform all signal amplification at the modulation frequency prior to demodulation to avoid amplification of DC errors at the demodulator output. The circuit employed as the demodulator must have superior DC offset and drift characteristics as these errors are indistinguishable from the electric field signal.

The reference signal for the detector is derived from the rotor using a phase-locked digital phasing circuit. The advantage of this technique is that it trades the mechanical complexity of prior art devices for simple electronic digital processing. It allows simple dip switch adjustment of the rotor reference signal as opposed to mechanical adjustment. A further benefit is that a very precise 50% duty cycle for the rotor reference signal can be achieved, giving the phase synchronous demodulator 66 dB DC common mode rejection. The mechanical analog implies machining tolerances of 18 seconds of arc and a slotted optical switch or magnetic detector with sub-microsecond symmetry of response.

Figure 20:
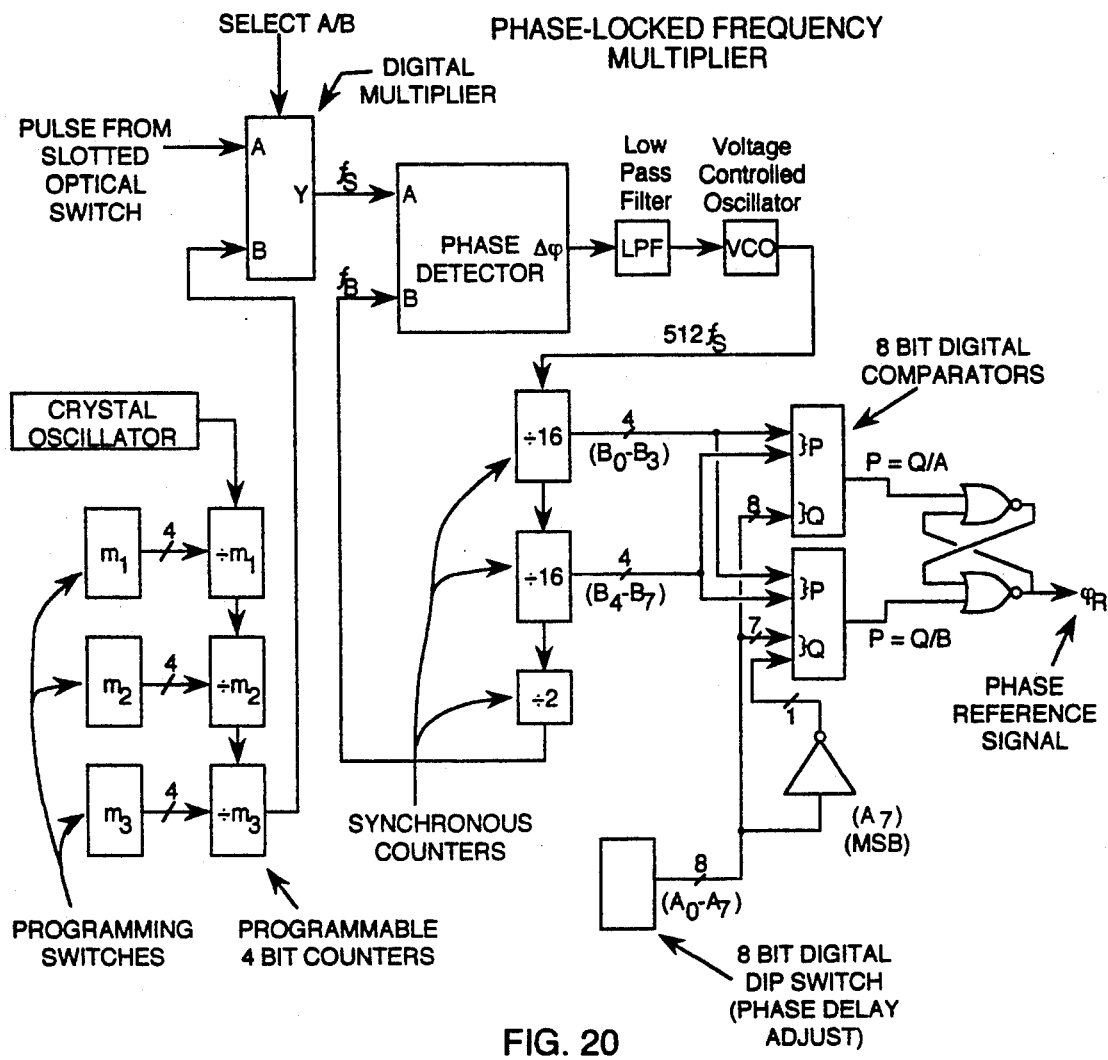
FIG. 20 is a functional block diagram of the Digital Phase Reference Generator.

The Digital Phase Reference Generator depicted in block diagram form in FIG. 20 is capable of synthesizing a square wave with a very precise duty cycle at frequencies that are even integral multiples of the rotor rotation frequency, and which has a phase relationship with the angular position of the rotor which is adjustable in discrete steps. Although in the preferred embodiment the integer multiples in the synthesized signal are even integer multiples, the invention can accommodate other configurations of rotor or sensing area but still using a similar timing pulse and a similar Generator circuit means producing a similar synthesized wave at a frequency of other integer multiples greater than the frequency of the timing pulse.

The input to this circuit in the preferred embodiment is a pulse from an optical slotted switch that is positioned to detect a single slot in an opaque disk mounted on the rear extension of the motor shaft. Another embodiment could utilize a reflective optical switch or a single magnet/Hall effect detector to produce one pulse per motor shaft revolution. The width of the pulse so produced is not critical since the Phase Detector is only edge sensitive.

The motor shaft derived pulse and the Digital Phase Reference Generator are the equivalent of a 9-bit optical shaft encoder. A phase-locked frequency multiplier comprised of the closed loop configuration of the Phase Detector, the Low Pass Filter, the Voltage Controlled Oscillator, and the Synchronous Digital Counters produces a signal at the output of the VCO that is 512 times the input pulse frequency.

Figure 21:
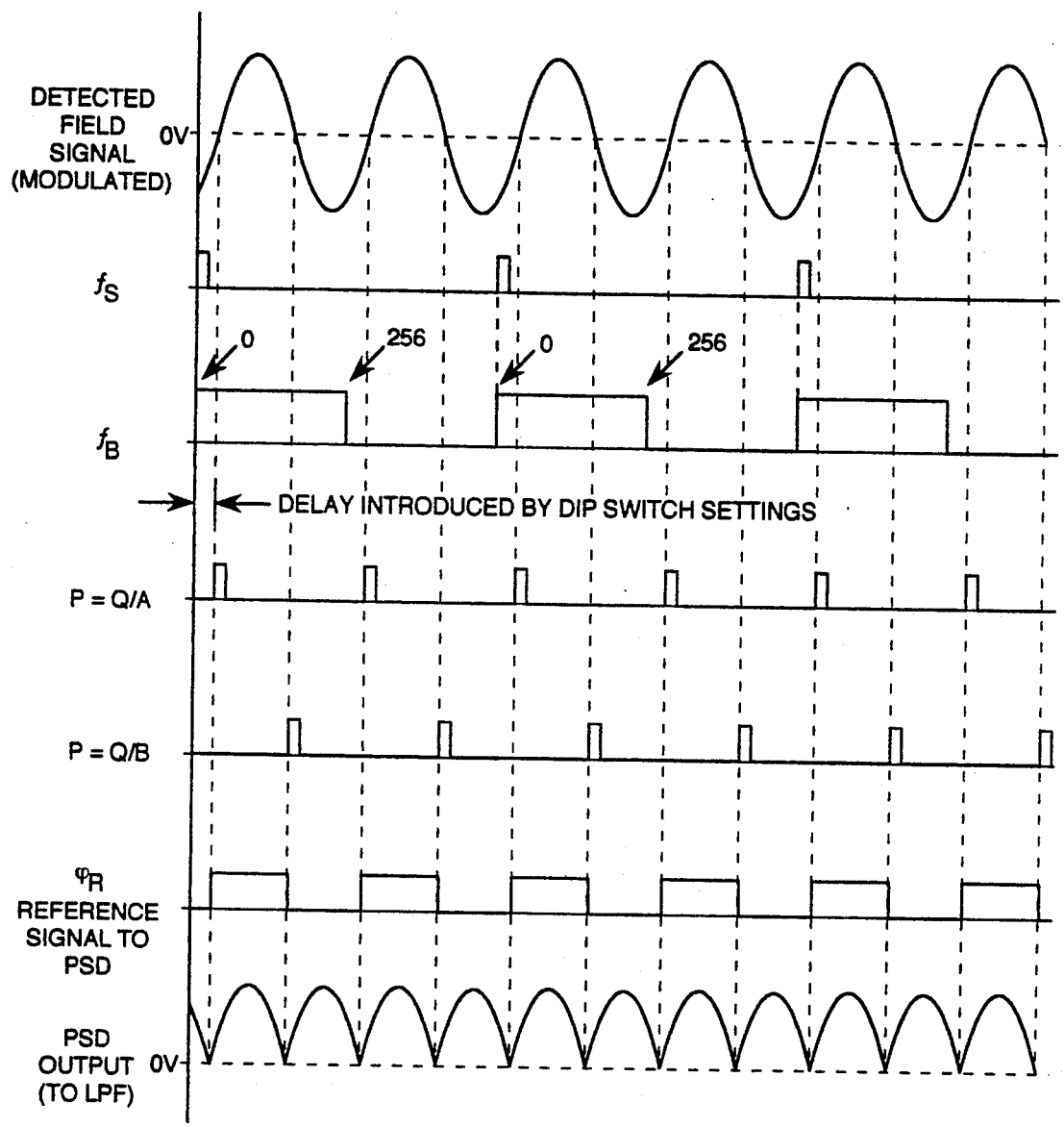
FIG. 21 is a timing diagram for FIG. 20.
Figure 22:
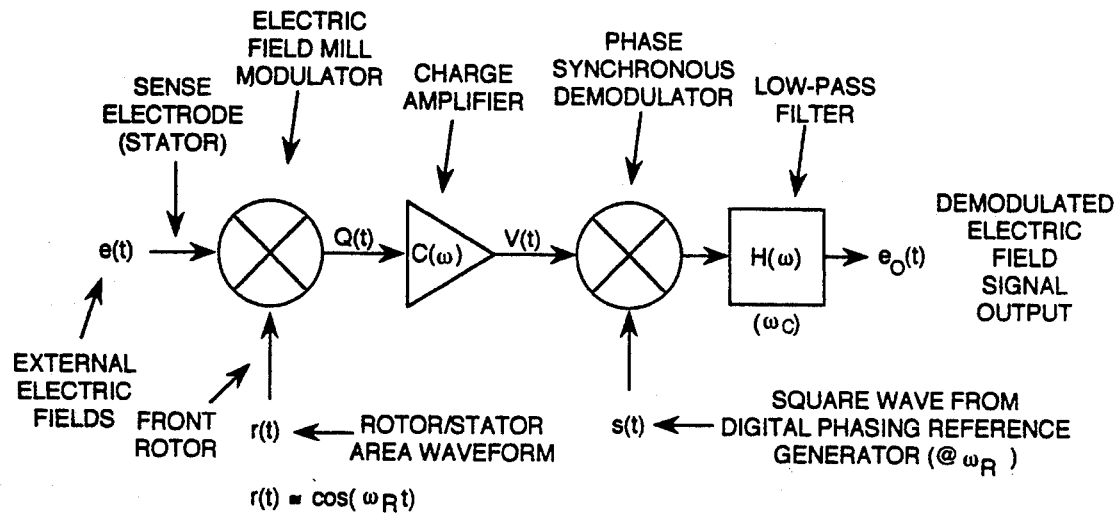
FIG. 22 is a signal processing model for the mechanical electric field modulator (sense head) and the electronic circuits which amplify and demodulate the electric field signal.
Figure 23:
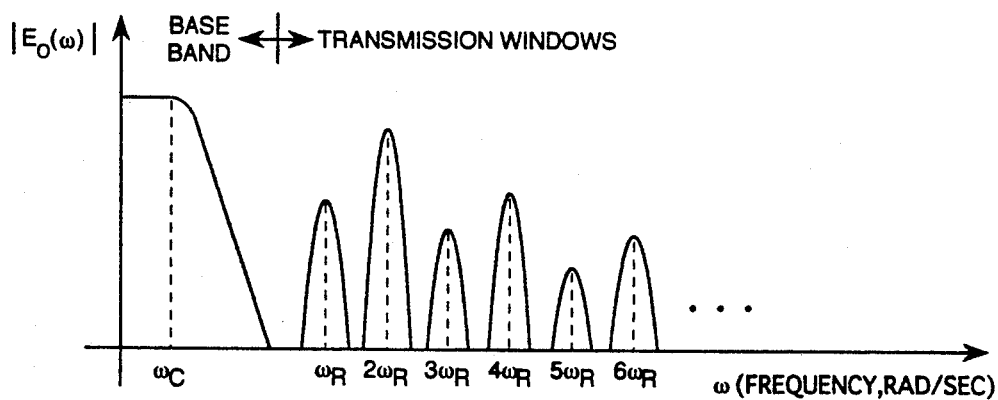
FIG. 23 describes the frequency response of the model of FIG. 22.

The Synchronous Counters are configured so that signal fB transitions high when they assume count state 0 and signal fB transitions low when they assume count state 256, as depicted in FIG. 21. The two 8-bit Digital Comparators compare the 8 least significant bits of the 9-bit counter with the setting of a digital dip switch to generate a pulse every 256 counts, or twice for every pulse input to the Phase Detector. One comparator has the most significant bit from the dip switch inverted so that its output pulse is offset by 128 counts from the pulse of the other comparator. By varying the setting of the dip switch, the comparator output pulses can be incrementally delayed relative to the pulse input to the Phase Comparator. With the comparator output pulses applied to the NOR SR Flipflop, a square wave of twice the frequency of, and with an adjustable phase relationship to, the pulses input to the Phase Detector is derived.

A linear phase, low pass filter preserving electric field step response fidelity follows the demodulator. This filter is second order and is required to average the demodulator output to utilize the full input signal range of the analog-to-digital converter. This also allows an analog signal proportional to electric field to be made available at the sensor location.

The non-linearity introduced by the signal processing stages from detector to low pass filter is limited to less than 0.015% by insuring that each stage has sufficient loop gain at the modulation frequency to adequately reduce amplifier open loop non-linearities.

Signal Digitization (FIG. 6)

A delta-sigma oversampling 14 bit analog-to-digital converter (ADU) converts the demodulated signal to a numerical representation. This converter is self-calibrating over the entire operating temperature range and has a serial peripheral interface (SPI) port to minimize interconnects with the micro-computer system. These interconnects are optically isolated to keep digital and motor circuit switching transients out of the analog circuits.

With its internal 6 pole Gaussian digital low pass filter, the ADU exhibits a 0 to 10 Hz frequency response. Its output register is updated 4000 times/second, but only 50 of these samples are read by the microcomputer every second.

The voltage reference used to provide an absolute reference for the ADU has a 25 ppm/degC voltage temperature coefficient.

Self-calibration by Electric Field Simulation (FIG. 6)

Electric field mills are normally calibrated by positioning an external conductor with an applied (variable) voltage to produce a known electric field. This means has the advantage of excluding the uncertainty of the ambient electric field, but requires a site visit to execute the procedure. Additionally, it can be difficult to achieve a precise calibration where the sensor is in an inverted configuration if the external conductor cannot be accurately positioned or if sensor support members interfere with the positioning.

Figure 24:
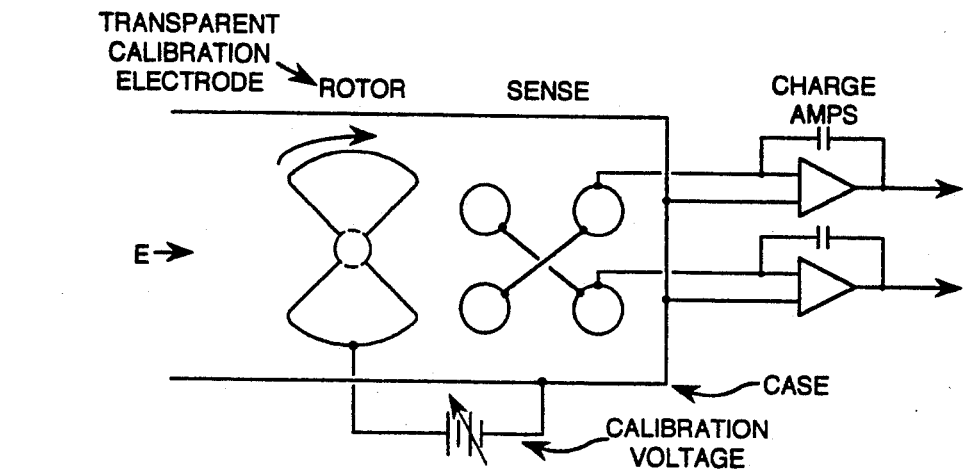
FIGS. 24, 25 and 26 are diagrammatic/schematic representations of arrangements for applying calibration voltages for three different embodiments of the invention.

The self-calibration means employed in the preferred embodiment utilizes electrodes that are permanently part of the sense head and are normally transparent to measuring the external electric field. In the transparent mode, the electrode is held at the sense head case potential. For calibration purposes, the potential on the electrode can be made different from the case potential to simulate an external electric field. FIG. 1 and FIG. 24 illustrate the preferred embodiment where the rotor is used as the transparent calibration electrode.

Figure 27:
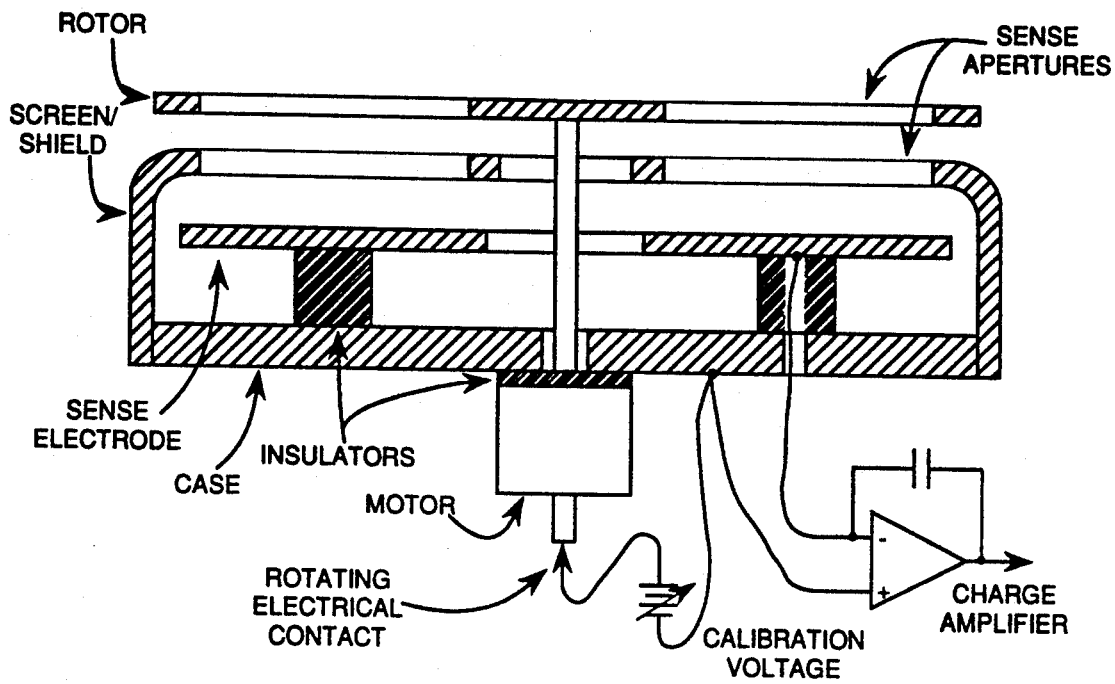
FIG. 27 is a cross section similar to FIG. 1 illustrating an alternative embodiment of a modulator showing an arrangement of a cup-shaped shield electrode, rotor and sensor electrodes with the rotor on the outside of the apertured cup-shaped shield which encloses a plate-like sense electrode.

FIG. 27 is another embodiment using the rotor as the transparent electrode, but incorporates an apertured cup-shaped screen electrode and single plate for a sense electrode that may take the form of FIG. 29A-29C or FIG. 30A-30C.

Figure 29A:
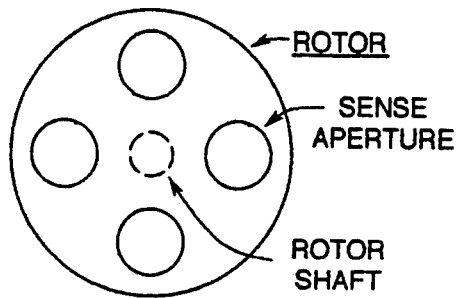
FIGS. 29a, 29b and 29c are views of one embodiment of the rotor, shield and sense electrodes of modulator of FIG. 27.
Figure 30A:
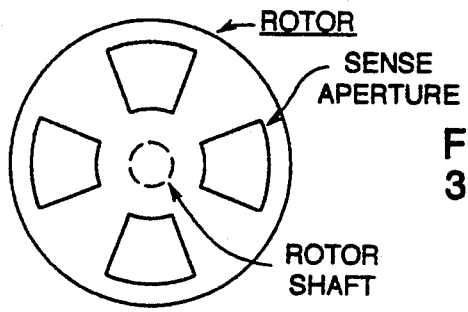
FIGS. 30a, 30b and 30c are views of another embodiment of the rotor, shield and sense electrodes of modulator of FIG. 27.
Figure 29B:
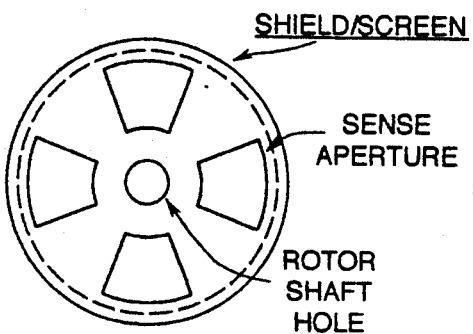
Figure 29C:
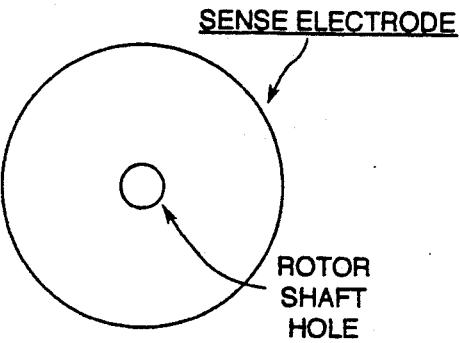

For the embodiment using the electrode configurations of FIG. 29A-29C the rotor or shutter electrode within the shield/screen cup has a set of four circular sense apertures or open areas alternating with complementary field-intercepting solid electrode portions and the shield/screen cup has a set of four sector-of-annulus shaped sense apertures or open areas alternating with complementary field-intercepting portions. The set of circular sense apertures or open areas of the shutter electrode periodically registers with the set of sector-of-annulus apertures of the shield/screen cup to provide exposure of a set of four circular sensing areas on the sense electrode once every 90 degrees of rotor rotation as the sense electrode is repeatedly exposed and covered by the rotor.

Figure 30B:
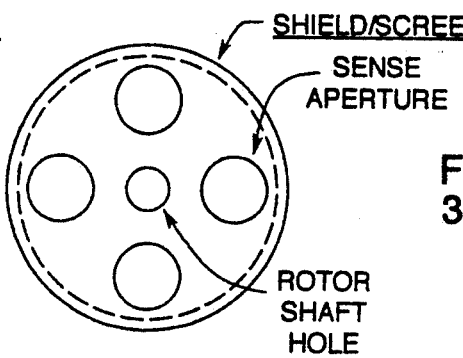
Figure 30C:
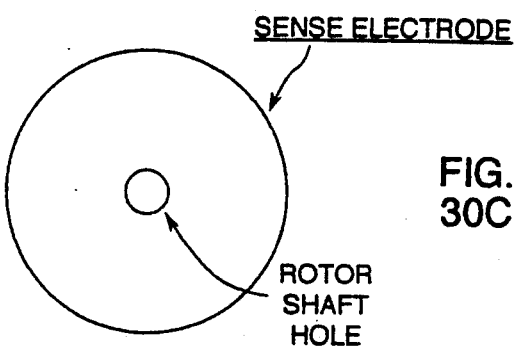

For the embodiment using the electrode configurations of FIG. 30A-30C the rotor or shutter electrode within the shield/screen cup has a set of four sector-of-annulus shaped sense apertures or openings alternating with complementary field-intercepting portions and the shield/screen cup has a set of four circular sense apertures or open areas, alternating with complementary field-intercepting solid portions. The set of sector-of-annulus shutter sense apertures periodically registers with the circular sense openings of the shield/screen cup to provide exposure of a set of four circular sensing areas on the sense electrode once every 90 degrees of rotor rotation as the sense electrode is repeatedly exposed and covered by the rotor.

Figure 25:
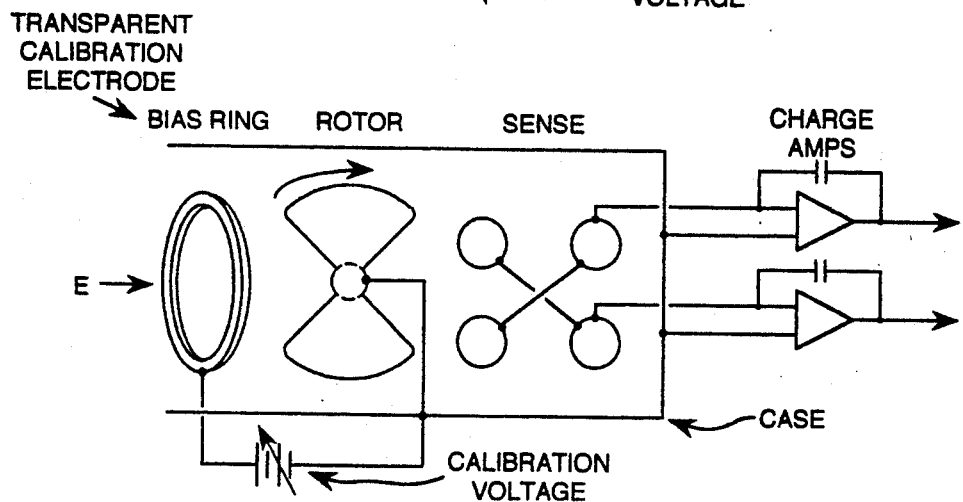

FIG. 25 illustrates another embodiment in which a ring electrode is physically attached as an extension of the modulator shield but is electrically isolated so that normal field detection can occur with the ring at case potential and field simulation for calibration can occur with a potential difference between the ring and the case.

Figure 26:
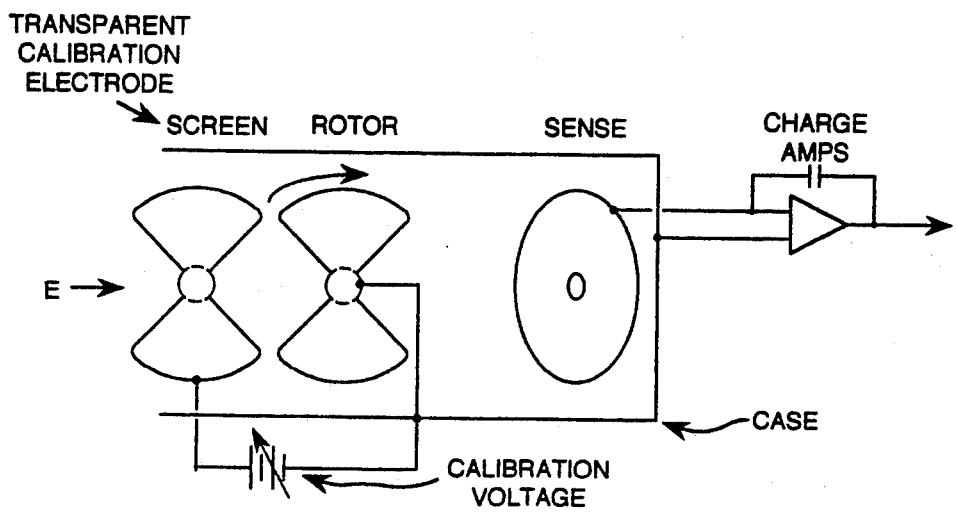

FIG. 26 illustrates another embodiment in which a fixed screen electrode acts as the transparent calibration electrode.

Figure 28:
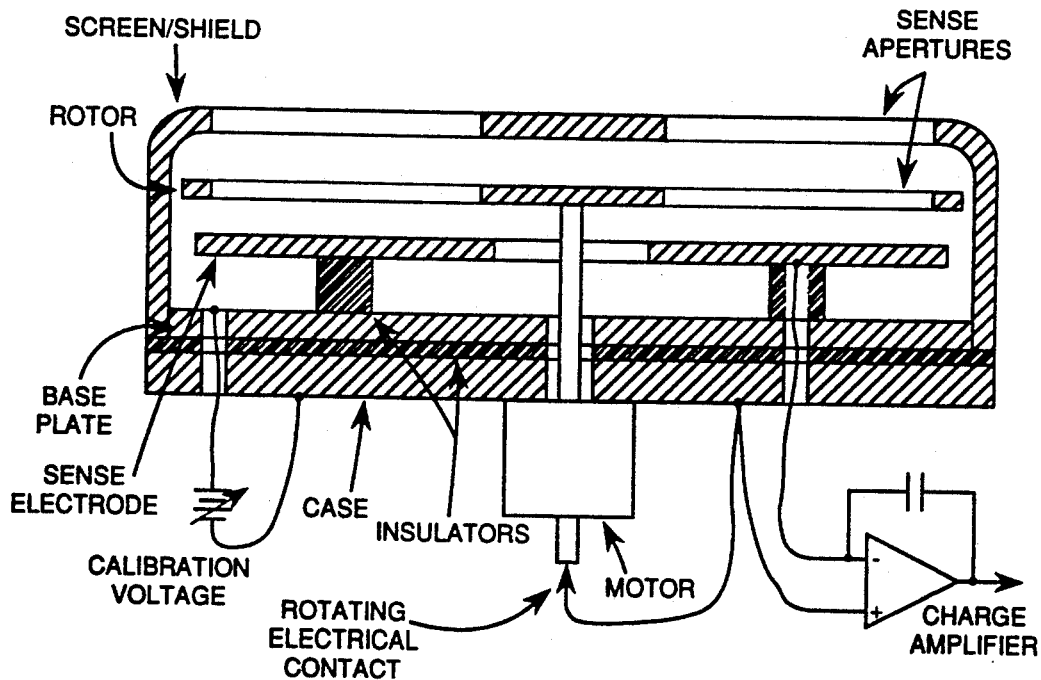
FIG. 28 is a cross section similar to FIG. 1 illustrating another alternative embodiment of a modulator showing a different arrangement of a cup-shaped shield electrode, rotor and sensor electrodes with the rotor within the apertured cup-shaped shield which encloses a plate-like sense electrode.

FIG. 28 illustrates another embodiment but with a cup-shaped screen which serves as a transparent electrode. The shield/screen and the base plate are electrically connected (by screen mounting screws) but insulated from the case so that a potential may be applied to the shield/screen via a wire connected to the base plate. In this embodiment the rotor is held at case potential.

FIG. 31 depicts an embodiment that combines use of the rotor as a transparent calibration electrode with means to compensate for contact potential difference effects. The outer rotor (rotor 1) is a shutter electrode means cyclically moved by the motor to vary the exposure of the sense electrode means to the electric field being measured to provide a normal modulated signal, related to the strength of the electric field, from the sense electrode means. This outer rotor is electrically isolated from the motor shaft by the rotor 1 insulator, but connected by a wire routed down the center of the gun-drilled motor shaft to a calibration voltage supply that is zero for normal field detection, but non-zero for field simulation. Rotor 1 has the bow-tie shape depicted in FIG. 32A. The sense electrodes have the sector shape depicted in FIG. 32B. Below the sense electrodes is another rotor (rotor 2) that is similar in bow-tie shape to rotor 1, but smaller and fixed to the motor shaft with its blades rotated 90 degrees with respect to the blades of rotor 1. The sense electrodes are spaced and electrically insulated from the other electrodes as seen in FIG. 31 and are secured to a base plate, on peripheral pedestal or foot portions of the electrodes at the outer extremity of each electrode, so that rotor 2, electrically connected to the rotor shaft, can rotate freely below the sense electrodes. The sense electrodes are secured by screws passing through suitable insulating supports and washers under their peripheral foot portions. Appropriate electrical connections are made by wires from the screws to the demodulating circuitry as used for other embodiments. All electrodes are located within a cylindrical shield, similar to shield 25 of FIG. 1, which is secured to the periphery of the base plate. A set screw in rotor 2 allows the the angular position of rotor 2 on the rotor shaft to be varied so as to be 90 mechanical degrees, but 180 electrical degrees, out of phase with respect to rotor 1. The distance between rotor 2 and the bottom face of the sense electrodes can also be adjusted. Rotor 2 is positioned along the motor shaft, closer to the underside of the sense electrodes so that the varying capacitance between it and the sense electrodes tends to vary in opposition to the capacitance between rotor 1 and the sense electrodes. In this manner, a capacitance that varies out of phase and of the same magnitude is introduced that cancels the variable capacitance between rotor 1 and the sense electrodes so that the total capacitance on which the contact difference of potential is imposed remains nearly constant (except for the fringing effects of the sense electrode gaps) and the error in the modulated signal from the sense electrode means due to the contact potential which limits the minimum electric field detectable is reduced.

The calibration voltage selectively applied to the shutter electrode means as shown in FIG. 31 induces a shift of the output modulation signal from the sense electrode means, from a normal modulation to a modified modulation signal, and the output indications from these modulation signals are compared to provide a correction factor for calibrating the quantitative output indication for the normal modulated signal as is similarly done with the sensors of FIGS. 5, 12 and 24. In these and other embodiments where calibrating voltages are selectively applied to the transparent electrodes, the application of the precision calibrating voltages occurs without changing the normal or non-calibrating position or physical character of the electrode means to which the calibrating voltage is applied. When the sense electrodes are sector shaped as in FIG. 32B, they provide essentially the maximum area for exposure to the external electric field. The number of sense electrodes is twice the number (N) of distinct cyclically movable field intercepting areas of the shutter rotor.

Under normal operating conditions, the output of a high voltage operational amplifier holds the rotor and motor case at system common via a low noise rotating contact. For sensor calibration "multiple different voltages such as 0 volts or", a positive or negative 40 VDC can be applied to the rotor on command by the microcomputer. This is equivalent to 20% of a full scale external electric field and is low enough to not be hazardous.

By applying a bipolar potential to the rotor, true end-to-end three point calibration and verification of sensor operation is achieved.

Figure 11A:
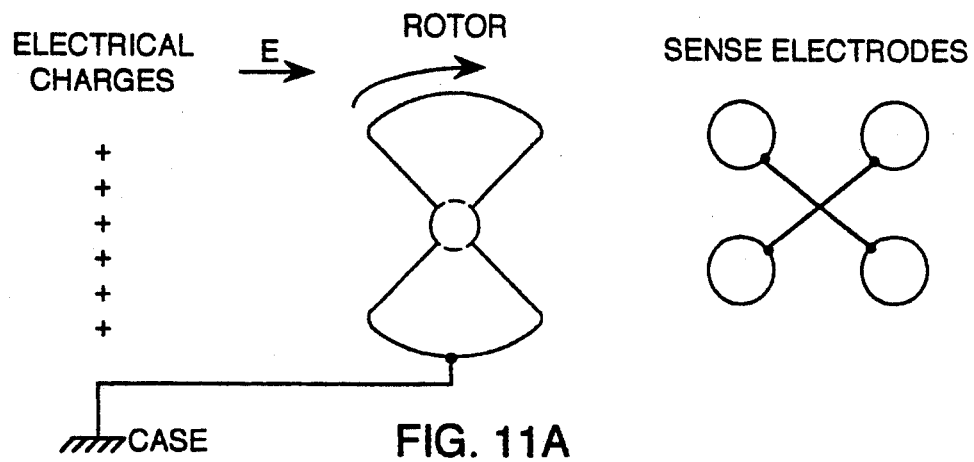
FIG. 11a is a diagrammatic representation of the relationship of a modulator sense electrode and a grounded rotor during field measurement.
Figure 11B:
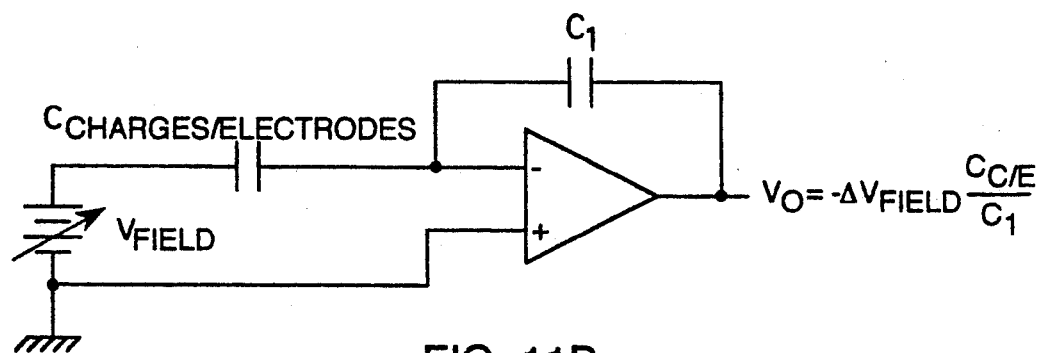
FIG. 11b is a schematic diagram for FIG. 11a with an amplifier connected.

The diagrams in FIGS. 11 (normal electric field sensing) and 12 (calibration mode) help explain the calibration means. FIG. 11A depicts a rotating grounded rotor intercepting electric field lines from charges external to the sensor. FIG. 11B shows an equivalent electrical model where the variation in the electric field lines terminating on a pair of sense electrodes is modeled by a variable voltage source while the coupling between the charges in the air (or on an external conductor) and the sense electrodes is modeled by fixed capacitance.

Figure 12A:
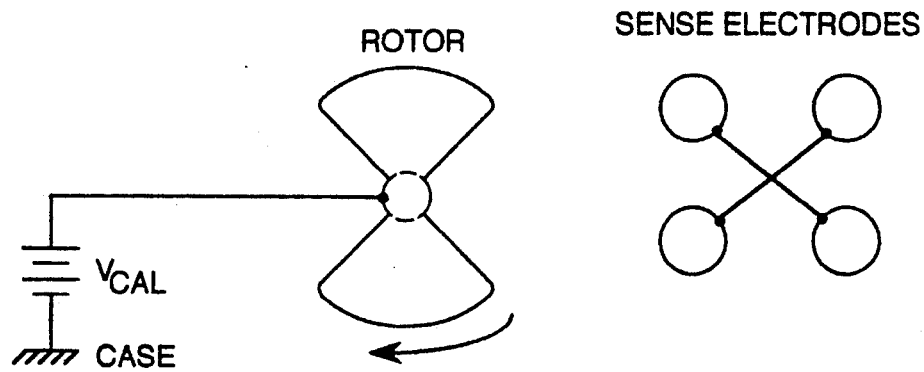
FIG. 12a is a diagrammatic representation of the relationship of a modulator sense electrode and a rotor with a calibrating voltage connected to the rotor.
Figure 12B:
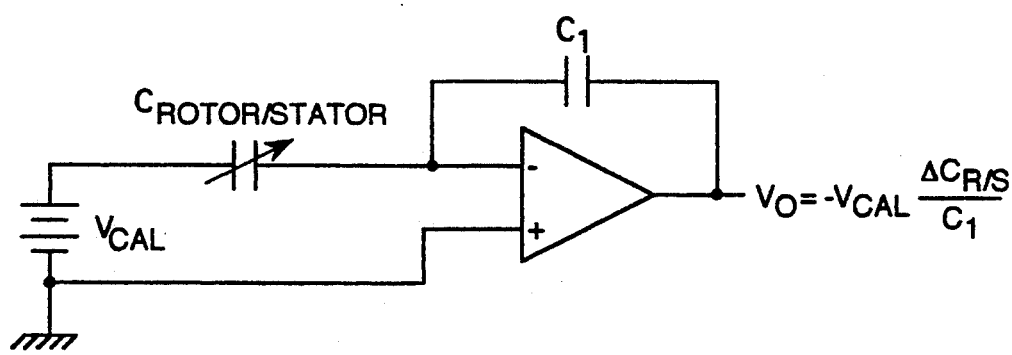
FIG. 12b is a schematic diagram for FIG. 12a with an amplifier connected.

FIG. 12A depicts the calibration mode where a constant voltage is applied to the moving rotor. FIG. 12B shows an equivalent electrical model where the variation in overlap between the moving rotor and a pair of sense electrodes is represented by a variable capacitor. This field simulation facility can detect sense head errors such as charged contamination accumulation or low impedance electrical connections between adjacent sense electrodes (e.g., spider webs) as well as electronic signal processing circuit errors. Combined with the application of multiple data points corresponding to multiple applied voltages, this field simulation technique allows the calculation of a sensor response curve. This curve should be a line from which the gain (slope), offset (intercept), and linearity (variance) of the sensor can be determined.

During fair field conditions, the change in the electric field at the surface of the earth is typically about 30 volts/meter over a few seconds. This corresponds to 0.1% of full scale, so a calibration field of 20% of full scale would produce an uncertainty of 0.5%. This combined with the $+/-1.25\%$ tolerance of the calibration voltages over temperature gives a net uncertainty in the accuracy of the calibration of $+/-1.75\%$.

The calibration voltage generator circuit is referenced to the same voltage reference device as the analog to digital converter, so sensor calibrations are ratiometric. As drawn, the calibration voltage generator circuit of FIG. 6 will produce a positive and a negative voltage for application to the rotor during sensor calibrations, and will hold the rotor at case potential via the low closed-loop output impedance of the inverting operational amplifier during normal electric field sensing. This circuit may be easily extended to generate more than one positive and negative output voltage.

Mercury-wetted rotating electrical contact to the rotor shaft exhibits negligible noise and is conservatively expected to operate for three years before failure.

Brushless DC Motor and Controller (FIGS. 1 and 5)

A brushless DC motor and closed-loop controller provide the low noise and high reliability required of the sensor. The motor is sized to provide excess starting torque and incorporates sealed bearings, but limits friction and drag torque to minimize operating power requirements. The controller can provide more power than is required under peak load conditions. Comprehensive motor system fault detection circuits in the controller enhance reliability and maintainability. The controller circuit is based on the Motorola MC33035 controller, the MPM3003 power module, and the MC33039 closed loop adapter.

The brushless DC motor used (BEI/Kimco DIV21-15-A) is conservatively expected to run continuously for three years before failure. The sealed bearings perform the necessary function of sealing around the motor shaft to prevent salt air from entering the motor housing and the interior of the electronics enclosure. The power consumption of the motor will be monitored and reported to the host computer as a means of giving an early warning of motor failure.

Video Display (FIG. 9)

A video text display provides a visual indication of current electric field conditions and sensor status for up to 8 electric field sensors. For electric fields exceeding an operator settable threshold and for sensor error conditions or component degradation signals such as insulation contamination or motor-wear produced overloads, the appropriate text entry will be highlighted (inverse video or blinking) and the computer's internal speaker will sound an acoustic alarm. Data for incorporation in this screen is in part taken from the Mode Character, Status and Time-of-Day sources listed below.

Embedded Microcomputer Data Processing and Control (FIG. 5)

The microcomputer system performs the essential functions of:
  a. Synchronizing the sampling of the electric field with timing requirements of the base station computer.
  b. Formatting the accumulated electric field data with sensor housekeeping data into data records.
  c. Transmitting the data records to the base station.
  d. Responding to base station commands to implement calibration and self-test procedures.

The microcomputer is based on the highly integrated Motorola MC68HC11 to minimize parts count and achieves low power operation with an all-CMOS configuration. The operating software for the MC68HC11 will consist of foreground tasks to format the data and interrupt-driven device drivers to handle the real time data acquisition and control.

The general mode of operation for the sensors will be to continuously sample the electric field, format the data with status and time of day information, and send the assembled data record once per second to the base station.

Sensor Data Record Format (FIG. 5)

The preliminary data record format transmitted from each sensor once each second is:

```
sync chars      (2)   ⎫
station addr    (1)   ⎪
mode            (1)   ⎬ header
status          (3)   ⎪
time of day     (6)   ⎭
data samples    (100) } data
CRC             (2)   } error checking
                (115)   characters
```

The synchronization characters form a pattern allowing the identification of the start of a data record.

The station address identifies which sensor is the source of the data record.

The mode character identifies the operational status of the sensor, assuming the following possible states:
1. Normal data acquisition
2. Calibration mode (executing 3 point rotor potential calibration procedure)
3. Self-test mode (performing internal checks)
4. Sensor inoperative (flag set by operator at host to signify that the sensor is not to be used in field measurement and display calculations).

The status bytes report operating and fault conditions of the sensor, and will include:
1. Motor fault flag
2. Motor velocity in RPS
3. Motor power consumption
4. Battery voltage
5. External 120 VAC fail flag
6. 120 VAC power line transient protector failure
7. Sensor timing synchronization status Time-of-day will take the form of 6 BCD characters:
1 byte = year
2 bytes = Julian day
1 byte = hour
1 byte = minute
1 byte = second A data sample will occupy 2 bytes and assume a two's complement notation.

The CRC bytes are computed (CRC-16) across the data record by the microcomputer to insure that erroneous information is not used and improperly interpreted.

Figure 7:
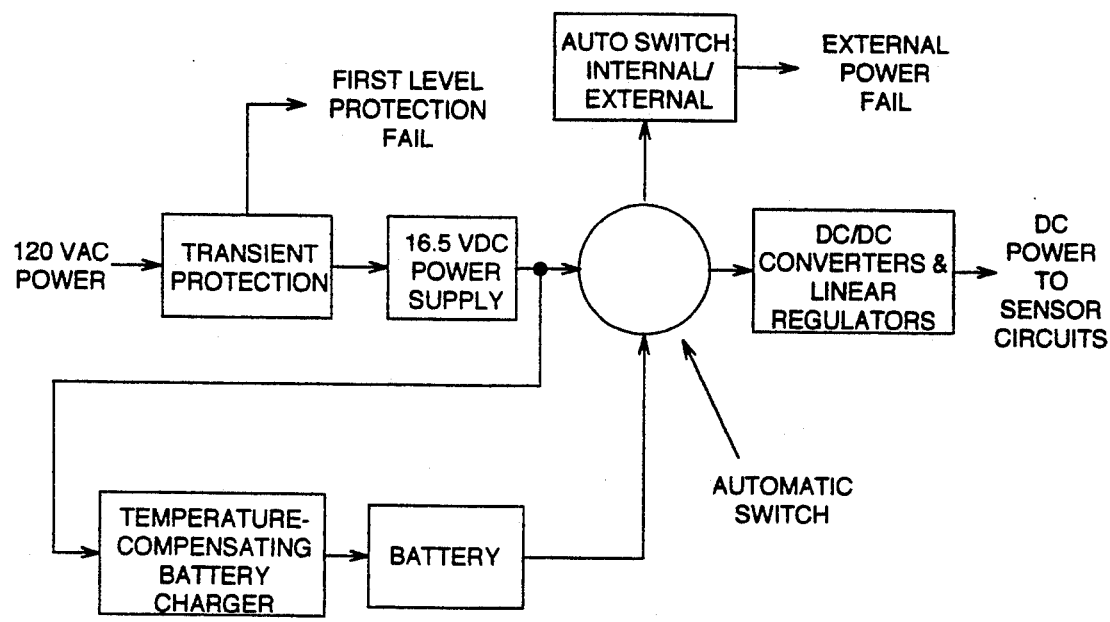
FIG. 7 is a block diagram of a power source for providing several different voltages or signals for operation of a sensor.

Synchronizing Data Acquisition from Sensors (FIG. 7)

An internal real time clock will be maintained and the time of day, according to the sensor electronics, will be inserted in the data records sent once per second to the host base station. This allows the host to assemble data records from multiple sensors for archiving without having to tag the records with the correct time of day: the host is free to buffer the received data records without having to keep track of transmission and buffering delays.

On power up, the sensor will default to relying on its internal real time clock driven by the microcomputer's crystal oscillator. This implies that field sampling across an array of sensors will be synchronized to within one sample period (20 ms) initially, but be subject to local oscillator time and temperature drift.

If the base station time code coordinator is active, a one pulse per second (1 PPS), 1 millisecond duration pulse will be broadcast to all sensors in the network over the twisted pair lines. With the asynchronous communication lines operating at 1200 baud, this signal will appear to the sensor serial receiver as a FFH or possibly a 7FH character. In the absence of a command prefix character, the signal can be reliably recognized as a timing synchronization character (the uniform 1 second interval can also be used as qualification criteria). The principal uncertainties involved in receiving, recognizing and responding to this timing signal are:
1. Transmission line delay = 1.5 microsec/mile for an unshielded line with 110 ohm impedance and 25 pf/ft capacitance.
2. Serial receiver start bit recognition delay = 1/16 bit time = 52 microseconds.
3. MC68HC11 interrupt latency = 12 microsec max.

These add up to much less than 1 millisecond. Since the execution time of the synchronization code will have a high degree of determinacy and repeatability, the internal real time clock can be easily set to the one second mark within one millisecond. The last requirement is then to have the host processor send the rest of the time of day information in the time between one millisecond pulses, which needs to be done only when the sensors have been power-cycled or reset, but can be done periodically.

Figure 8:
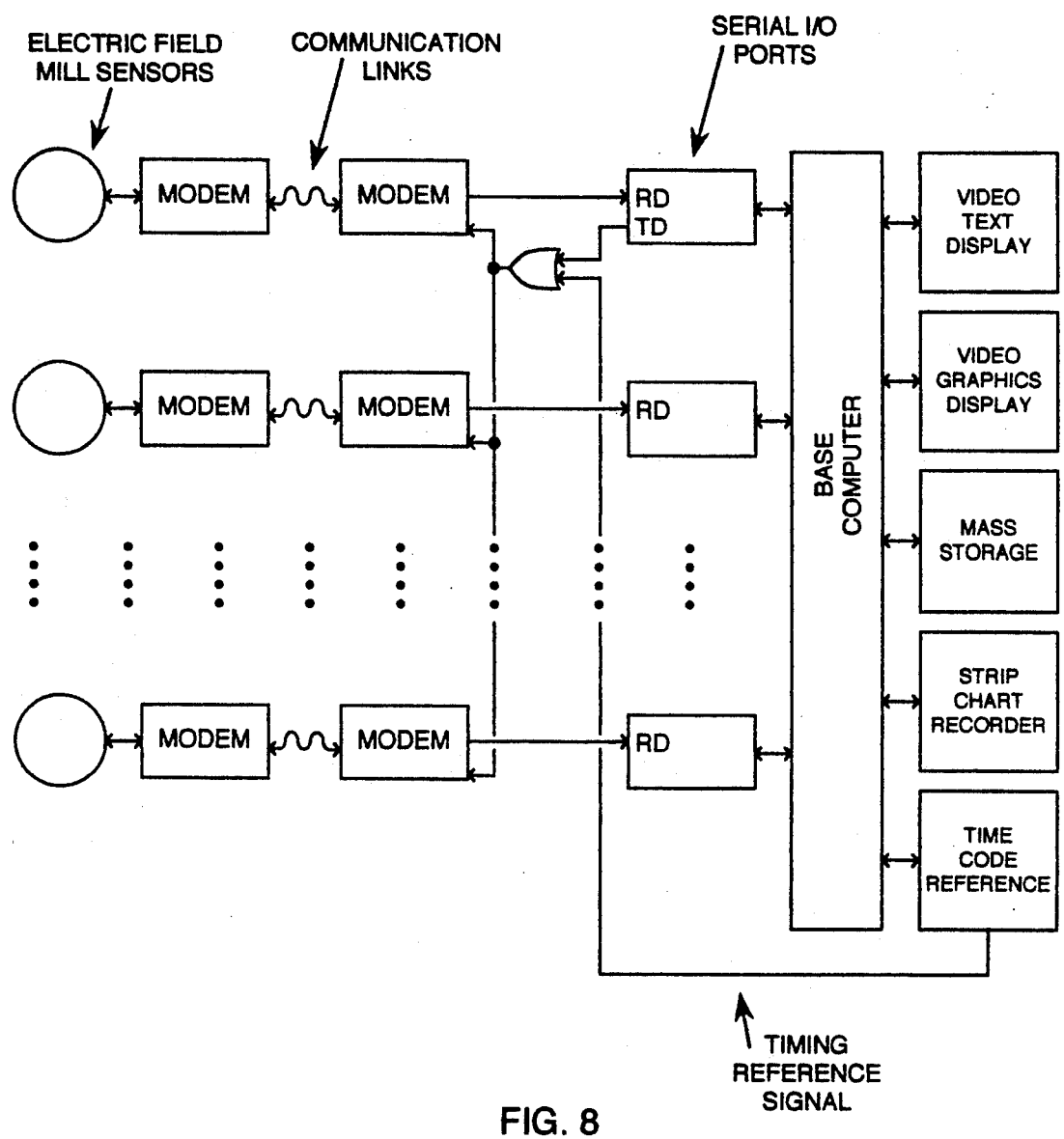
FIG. 8 is a schematic/block diagram illustrating the relationship of a base station microcomputer interfaced with a plurality of remote sensors.

Power Conditioning (FIG. 8)

The electric field sensor normally operates from 120 VAC line power. Two level, fault-detecting transient protection on the line input insures that the system is protected by a secondary protector until the first protector can be replaced. The primary protector is a high energy, silicon avalanche diode based unit. The secondary protector is MOV-based. Power line transient protection at the sensor input is considered necessary to ensure reliability.

Optional battery-backed operation with a temperature compensated battery charger provides the capability of noiselessly switching to battery operation should the line power be interrupted. While the risk of a power outage or brownout is high during thunderstorm activity, a user may wish to ensure uninterrupted power by alternate means.

Motor and motor controller operation down to 9 VDC allows direct operation from battery voltages. The warning strobe light and acoustic alarm can also operate directly from battery voltages.

A low power, high efficiency DC/DC converter isolates the sensitive analog signal processing circuits. The low power logic circuits require only a simple step-down voltage regulator. The field calibration system utilizes an isolated, high voltage output DC/DC converter (+/−45 VDC).

The extreme environmental conditions under which the inverted electric field sensor must operate strongly influence the support structure configuration. The monolithic, welded, aluminum tripod support for the inverted sensor allows reliable electric field measurements to be made while resisting the effects of sea-spray corrosion, high winds, rain and lightning.

Text Formatter Task (FIG. 9)

Receives output of CRC Calculation Task for text display of sensor status on video display and output of Data Average Task for text display of field value on video display. Also receives output of Alarm Driver Task to highlight alarm conditions on the display. All aspects of sensor status will be displayed either directly or via operator requested secondary windows. Any fault condition will assume a direct display status.

Tape Read Task (FIG. 7)

Reads data files from tape for "instant replay" playback. Allows verification of recorded data.

Strip Chart Driver Task (FIG. 7)

Receives output of CRC Calculation Task to provide uniformly timed field samples to the Digital-to-Analog Converter.

Alarm Driver Task (FIG. 9)

Filters the output of the Data Averaging Task and the CRC Calculation Task in terms of parameters set by the Keyboard Command Interpreter Task to detect sensor error conditions and hazardous electric field conditions. Drives computer's audio transducer for audible alarm.

Graphical Video Strip Chart Display (FIG. 9)

Software supports video stripchart display of the values of the electric field as reported by 4 to 8 sensors. Update rate is selectable with a maximum rate of 2 seconds/sample displayed. An 80387-SX (16-MHz) numeric coprocessor is included.

Calibration and Acceptance Testing

The net electric field sensitivity of the instrument is a combination of:
1. Support stand field enhancement.
2. Modulator sensitivity.
3. Signal processing circuitry gain.

Calibration procedures for the electric field mill sensor will quantify total absolute sensor sensitivity as well as the sensitivities of major sensor subsystems.

The primary procedure establishing total absolute sensitivity will be a comparison of the elevated, inverted mill field response to that of a calibrated upward-looking mill mounted flush with the earth's surface.

Calibration in the lab of the electronic signal processing circuits combined with the field modulator via parallel plate field simulation will establish the interchangeability of the modulator and its electronics. Parallel plate calibration is accomplished by applying a reference high voltage across two parallel stainless steel plates that attach to the bottom of the electronics housing. The upper plate has a circular opening in the center to allow the modulator to be exposed to the field between the plates.

A set of parallel plates with or without a high voltage reference to allow precision calibrations at the sensor sites can be optionally provided. This procedure eliminates the uncertainty of ambient electric field drift and the temperature-based error tolerance of sensor internal high voltage reference.

Field calibrations of the inverted mill by the rotor potential method and or the parallel plate method will serve to indicate mill sensitivity change due modulator contamination or long term drift of electronic component values.

Electric Field Sensor Specifications

| | | |
|---|---|---|
| 1. | Operational temperature range: | −25 deg C. to +85 deg C. |
| 2. | Sensitivity at input to ADU: | 83 microvolts/volt/meter |
| 3. | Resolution: | 3.7 volts/meter |
| 4. | Dynamic range | +/−30 kv/meter |
| 5. | Intrinsic electrical noise: | <2 volts/meter, DC & AC (Electronics less modulator) |
| 6. | Equivalent extrinsic noise: | <60 volts/meter, DC (Zero field error) |
| 7. | Bandwidth: | 0 to 10 Hz (−3 dB) |
| 8. | Analog to digital converter: | |
| | a. Sampling rate: | 50 samples/second |
| | b. Resolution: | 14 bits |
| | c. Non-linearity: | 0.015% max |
| | d. Input noise: | <2 LSB, DC<br><1 LSB, 0.1 Hz to 1 kHz |
| 9. | Absolute gain error | +/−2% max (at 25 deg C.), compared to a calibrated, ground flush-mounted sensor |
| 10. | Gain error over temperature: | +/−2.5% max |
| 11. | Modulation frequency: | 85 Hz, +/−5% |
| 12. | Modulator insulator contamination error: | 1 LSB max for 350 Kohm insulator resistance |
| 13. | Modulator materials: | Chemically polished type 316 CRES; non-hygroscopic non-piezoelectric "Kel-F" (PCTFE) polychlorotri-fluoroethylene insulators |
| 14. | Detector input transient protection: | 1500 Watt Transorb, each phase |
| 15. | 60 Hz line interference rejection: | −40 dB min at 60 Hz and 120 Hz |
| 16. | Electric field sensitivity self-calibration subsystem | |
| | a. Calibration technique: | 3 point, true field simulation via active drive of rotor potential |
| | b. Calibration points: | 1) 0 volts/meter, (+/−20 v/m max)<br>2) +6 kilovolts/meter, (+/−1.25% max)<br>3) −6 kilovolts/meter, (+/−1.25% max) |
| | c. Calibration voltages: | 0 volts, +40 volts, −40 volts |
| | d. Calibrator output transient protection: | 1500 Watt Transorb |
| 17. | Phasing reference signal generation: | |
| | a. Technique: | Digital/phase-locked loop |
| | b. Adjustment method: | Dip switch |
| | c. Resolution: | 1.4 electrical degrees |
| 18. | Rotor motor drive system: | |
| | a. Motor type: | Brushless DC with sealed bearings |
| | b. Motor operating speed: | 2550 RPM, +/−5% max |
| | c. Controller type: | 2 quadrant, closed loop |
| | d. Excess starting torque: | 3.7 times friction torque (includes sealed bearing) |
| 19. | Electrical contact to rotor: | Low-noise, high-reliability mercury rotating contact |
| 20. | Warning device at sensor: | 1 million candle power electronic strobe Piezoelectric acoustic alarm |
| 21. | Analog output port: | +/−10 volts full scale, proportional to electric field |
| 22. | Built-in remotely controlled self-test, calibration and fault diagnosis: | |
| | a. Remote calibration by active rotor drive. | |
| | b. Motor fault detection with remote fault indication:<br>1. Motor speed monitor.<br>2. Overcurrent detection and protection. | |

-continued

3. Undervoltage lockout for controller.
4. Thermal shutdown.
5. Motor power monitor.
d. Micro-computer self-check.
e. Battery voltage monitor.
f. External 120 VAC fail detection.
g. 120 VAC power line transient protector failure detection.
h. synchronization status.
23. Low power operation: 12 VDC at 1.75 amps (Strobe light inactive) 12 VDC at 2.75 amps (Strobe light active)
24. Support stand features:
   a. Rigid, inverted support for modulator.
   b. Corrosion resistant aluminum with marine grade white paint.
   c. Electronics enclosures rated NEMA 3, 4X and have rounded edges and corners.
   d. Free-standing or permanent bolt tie-down.
   e. Supporting arms remote from vicinity of modulator.
25. Lightning and transient protection for all components.
26. Environmental:
   a. Temperature: −25 deg C. to +85 deg C.
   b. Humidity: 0 to 100% RH, condensing
   c. Rain: up to 80 mm/hr.
   d. Wind: No wind induced modulator vibration noise.
   e. Sand and dust: As encountered in U.S. coastal regions
   f. Fungus: No fungus nutrient materials used.

Other variations within the scope of this invention will be apparent from the described embodiment and it is intended that the present descriptions be illustrative of the inventive features encompassed by the appended claims.

What is claimed is:

1. A sensor for measuring the polarity and amplitude of a low frequency electric field comprising:
sense electrode means exposable to the electric field to provide an electrical signal thereon responsive and related to the field, movable shutter electrode means for varying the exposure of the sense electrode means to the electric field, additional electrode means, including at least shield electrode means, for affecting the path of the lines of force of the electric field at the sense electrode means,
motor means connected to the shutter electrode means to cyclically move the shutter electrode means to vary said exposure to provide a normal modulated signal from the sense electrode means,
means for demodulating said modulated signal to provide a quantitative output indication of the strength of the electric field and an indication of its polarity,
means for applying a precise voltage to one of said additional or shutter electrode means during operation of the sensor, without changing the position of said one electrode means from its position during operation of the sensor which provides said normal modulated signal, to induce a known shift in the voltage of said sense electrode means and a modified modulated signal, and means for comparing the output indications from the normal and modified modulated signals to provide a correction factor for calibrating the quantitative output indication for the normal modulated signal.

2. A sensor according to claim 1 wherein means are provided to apply multiple different precision voltages at different times to said one electrode means and to provide an output indication responsive to each of the respective modified modulated signals to provide output data for calibrating the indication of the normal modulated signal.

3. A sensor according to claim 2 wherein three different precise voltages are applied to said one electrode means.

4. A sensor according to claim 3 wherein said precise voltages are +40, 0, and −40 volts DC.

5. A process for calibrating a sensor of a type defined in claim 2 wherein the calibration is performed by applying said multiple precision voltages while the electric field is at fair field conditions.

6. A sensor according to claim 1 including sensitive sensing and demodulating means capable of providing accurate indications of measured electric fields lower than +/−1 Volt/meter.

7. A sensor for measuring the polarity and amplitude of a low frequency electric field comprising:
sense electrode means exposable to the electric field to provide an electrical signal thereon responsive and related to the field, movable shutter electrode means for varying the exposure of the sense electrode means to the electric field,
additional electrode means including at least shield electrode means for affecting the path of the lines of force of the electric field at the sense electrode means, said shield electrode means encircling said sense electrode means to essentially confine the lines of force of the electric field which enter the sensor and pass to the sense electrode means to paths which are intercepted by the shutter electrode means, motor means connected to the shutter electrode means to cyclically move the shutter electrode means to vary said exposure to provide a normal modulated signal from the sense electrode means,
means for demodulating said modulated signal to provide a quantitative output indication of the strength of the electric field and an indication of its polarity, means for calibrating said sensor to determine the quantitative output indication for the normal modulated signal, a printed circuit board containing electrical circuit means for operating the sensor including the demodulation means, a weatherproof enclosure having a flat wall, means for securing the printed circuit board within the enclosure adjacent to said flat wall, registering apertures in said board and in said wall, means for supporting all said electrode means together as a sensing head on the outside of the wall over said registering apertures,
said motor means extending from said shutter electrode means through said apertures and within said enclosure.

8. A sensor according to claim 7 including a legged structure for supporting said enclosure from the ground with said sensing head facing downwardly and at a distance from approximately 24 to 48 inches above the ground.

9. A sensor according to claim 8 wherein said enclosure has a visual alarm indicator on the enclosure, and means responsive to a predetermined condition of the electric filed for actuating said alarm.

10. A sensor according to claim 8 wherein said enclosure has a audio alarm indicator on the enclosure, and means responsive to a predetermined condition of the electric filed for actuating said alarm.

11. A sensor according to claim 7 including a printed circuit board within said enclosure containing an embedded digital computer CPU and related data processing means for controlling operation of the sensor.

12. A sensor according to claim 11 including a communications port extending externally of the enclosure for communicating measured data or control and test information between the sensor and a local external computer or a remote central computer forming part of a multi-sensor system.

13. A sensor for measuring the polarity and amplitude of a low frequency electric field comprising:
sense electrode means exposable to the electric field to provide a signal responsive and related to the field,
shield electrode means for affecting the path of the liens of force of the electric field at the sense electrode means, shutter electrode means rotatable about a fixed axis and having modulating portions for varying the exposure of the sense electrode means to the electric field,
said shield electrode means encircling said sense electrode means to essentially confine the lines of force of the electric field which enter the sensor and pass to the sense electrode means to paths which are intercepted by the shutter electrode means,
motor means connected to the shutter electrode means to cyclically rotate the shutter electrode means around its axis to vary said exposure to provide a modulated signal from the sense electrode means,
insulating means supporting said sense electrode means in substantially spaced relationship relative to said shutter and shield electrode means, said insulating means being effectively hidden from said shutter means so that errors in the quantitative indication of the strength of said electric field due to interaction between said modulating portions of said shutter electrode means and said insulating means, resulting from their relative movement, are minimized,
and means for demodulating said modulated signal to provide a quantitative indication of the strength of the electric field and an indication of its polarity,
said sense electrode means being located relative to both the shield and shutter electrode means to provide a first set of areas which are exposable sensing areas of said sense electrode means uniformly spaced circumferentially around said axis for sensing charges from the electric field,
said shutter electrode means having a second set of areas which are open areas alternating around its axis with field intercepting electrode portions thereof whereby said sets of areas are periodically in registration to alternately expose and cover said sensing areas of said first set,
each area of one of said first and second sets of areas at the time of registration of the sets of areas being circular and the areas of the other of said first and second sets at said time extending between lines at opposite sides of the respective circular field sensing area with the lines extending radially perpendicular to said axis, each such circular field sensing area being at a distance from the rotor axis less than the diameter of the respective circular field sensing area.

14. A sensor according to claim 13 wherein there are four such areas in at least one of said sets.

15. A sensor according to claim 14 wherein the open areas of the shutter electrode means are round.

16. A sensor according to claim 15 wherein the sensing areas are part of the surface of a flat conducting disk.

17. A sensor according to claim 14 wherein said sensing electrode areas at times of maximum exposure are round.

18. A sensor according to claim 17 wherein the sensing areas are part of the surface of a flat conducting disk.

19. A sensor for measuring the polarity and amplitude of a low frequency electric field comprising:
sense electrode means exposable to the electric field to provide a signal responsive and related to the field,
shield electrode means for affecting the path of the lines of force of the electric field at the sense electrode means, rotatable shutter electrode means for varying the exposure of the sense electrode means to the electric field,
motor means connected to the shutter electrode means to cyclically rotate the shutter electrode means to vary said exposure to provide a modulated signal from the sense electrode means,
means for generating for each cycle of movement of the shutter electrode a timing pulse having a fixed phase relationship to the phase of the modulated signal and to the angular position of the shutter means,
circuit means for generating a reference signal with a frequency equal to an integer multiple of and greater than the frequency of the timing pulse, means for adjusting said reference signal in discrete steps of phase relative to said timing pulse,
and means responsive to the phase adjusted reference signal for demodulating said modulated signal to provide a quantitative indication of the strength of the electric field and an indication of its polarity.

20. A sensor in accordance with claim 19 wherein said circuit means produces a square wave reference signal with a highly precise duty cycle and said demodulating means is a phase synchronous detector.

21. A sensor in accordance with claim 19 wherein said circuit means for frequency multiplication includes a phase-locked loop frequency multiplier.

22. A sensor in accordance with claim 21 including means to selectably control said motor to run at a selected frequency,
said selected frequency being chosen to avoid the fundamental or harmonics of the frequency of the most common or troublesome external noise to which the sensor is subjected.

23. A sensor according to claim 22 wherein said selected frequency is 85 Hz. to stay away from 60 Hz. powerline noise.

24. A sensor in accordance with claim 19 including a device actuated by the motor and to produce only a single such timing pulse per motor revolution.

25. A sensor according to claim 24 including means responsive to said single timing pulse to control the demodulator so that the output field measurement indications are accurate and of proper sign regardless of the angular position of the shutter when the timing pulse is generated.

26. A sensor for measuring the polarity and amplitude of a low frequency electric field comprising:
sense electrode means exposable to the electric field to provide a signal responsive and related to the field,
shield electrode means for affecting the path of the lines of force of the electric field at the sense electrode means,
movable shutter electrode means for varying the exposure of the sense electrode means to the electric field,
motor means connected to the shutter electrode means to cyclically move the shutter electrode means to vary said exposure to provide a modulated signal from the sense electrode means,
means for generating for each cycle of movement of the shutter electrode a timing signal indicative of the phase of the modulated signal relative to the position of the shutter means,
and means responsive to the timing signal for demodulating said modulated signal to provide a quantitative indication of the strength of the electric field and an indication of its polarity,
motor control means for stopping said motor means to stop modulation of the field signal from the sense electrode means,
said demodulation means including means operable while the motor is stopped and responsive to degradation of the sense electrode means due to environmental contamination to provide an output signal indicative of the amount of sense electrode means contamination.

27. A sensor in accordance with claim 26 including an insulator means for supporting a sense electrode of said sense electrode means, and wherein said demodulation means provides an output signal indicative of the environmental contamination of said insulator means.

28. A sensor head for measuring the polarity and amplitude of a low frequency electric field comprising:
sense electrode means having several relatively large flat coplanar sensing areas exposable to the electric field to provide a signal responsive and related to the field,
shield electrode means for affecting the path of the lines of force of the electric field at the sense electrode means,
movable shutter electrode means rotatable about an axis and parallel to said sensing areas for varying the exposure of the large flat sensing areas of the sense electrode means to the electric field,
motor means connected to the shutter electrode means to cyclically move the shutter electrode means to vary said exposure to provide a modulated signal from the sense electrode means, said shutter electrode means being rotatable while varying the exposure of each large flat sensing area so that for each such sensing area the shutter electrode means moves periodically between respective positions in which the respective sensing area is covered by the shutter electrode means and in which that respective sensing area is so uncovered by the shutter electrode means as to have a circular area exposed to the electric field with such circular area being spaced from said axis a distance less than the diameter of the respective circular area,
and means for demodulating said modulated signal to provide a quantitative indication of the strength of the electric field and an indication of its polarity,
each of said electrode means, including said large flat sensing areas, having bare metal portions of stainless steel exposed to the environment at the outside of the sensor head,
said bare metal portions each having an extremely smooth highly-reflective polished finish to minimize corrosion and contamination caused by any hostile matter in the environment around the head.

29. A sensor head according to claim 28 wherein said finish is mirror-like.

30. A sensor head according to claim 28 wherein said finish is a conventional #7 or #8 finish.

31. A sensor head according to claim 28 wherein said finish is produced by chemical polishing.

32. A sensor head according to claim 28 wherein said finish is produced by electro-polishing.

33. A sensor head according to claim 28 wherein the material of the electrodes of all the electrode means is 316 CRES stainless steel.

34. A sensor for use in measuring a low frequency electric field comprising:
sense electrode means exposable to the electric field to provide an electrical signal thereon responsive and related to the field, movable shutter electrode means for varying the exposure of the sense electrode means to the electric field,
motor means connected to the shutter electrode means to cyclically move the shutter electrode means to vary said exposure to provide a modulated signal related to the strength of the electric field from the sense electrode means,
compensating electrode means capacitively coupled to said sense electrode means and cyclically moved by said motor means to vary the capacitance between the compensating electrode means and the sense electrode means in opposition to variations in the capacitance between the shutter electrode means and the sense electrode means to reduce errors in said modulated signal from the sense electrode means,
and means for demodulating said modulated signal to provide a quantitative output indication of the strength of the electric field.

35. A sensor for use in measuring a low frequency electric field according to claim 34 wherein said shutter electrode means comprises N distinct electrode areas cyclically movable between the electric field and the sense electrode means and said sense electrode means comprises 2N sense electrodes cyclically exposed by the shutter electrode means.

36. A sensor for use in measuring a low frequency electric field according to claim 34 wherein said shutter electrode means comprises a bow-tie shape rotor supported on a shaft of said motor means and at a first side of said sense electrode means which is exposed to the electric field, said sense electrode means comprising four sense electrodes symmetrically located around the motor shaft, and said compensating electrode means comprising electrodes located at the opposite or second side of the sense electrode means which faces away from the electric field.

37. A sensor for use in measuring a low frequency electric field according to claim 36 including electrically insulating means between said shutter electrode rotor and the shaft of said motor means.

38. A sensor for use in measuring a low frequency electric field according to claim 37 including means for electrically hiding said electrically insulating means from said sense electrode means to reduce the effect on said modulated signal of any charges on the insulating means.

39. A sensor for use in measuring a low frequency electric field according to claim 34 and further including means for applying a precise voltage to said shutter electrode means during operation of the sensor to induce a known shift in the voltage of said sense electrode means to change a normal modulated signal to a modified modulated signal, and means for comparing the output indications from the normal and modified modulated signals to provide a correction factor for calibrating the quantitative output indication for the normal modulated signal.

40. A sensor for measuring the polarity and amplitude of a low frequency electric field comprising:

sense electrode means exposable to the electric field to provide a signal responsive and related to the field, shield electrode means for affecting the path of the lines of force of the electric field at the sense electrode means, shutter electrode means rotatable about a fixed axis for varying the exposure of the sense electrode means to the electric field, said shield electrode means encircling said sense electrode means to essentially confine the lines of force of the electric field which enter the sensor and pass to the sense electrode means to paths which are intercepted by the shutter electrode means, motor means connected to the shutter electrode means to cyclically rotate the shutter electrode means around its axis to vary said exposure to provide a modulated signal from the sense electrode means, insulating means supporting said sense electrode means in substantially spaced relationship relative to said shutter and shield electrode means, said insulating means being effectively hidden from said shutter means so that errors in the quantitative indication of the strength of said electric field due to interaction between said shutter electrode means and said insulating means, resulting from their relative movement, are minimized, and means for demodulating said modulated signal to provide a quantitative indication of the strength of the electric field and an indication of its polarity, said sense electrode means being located relative to both the shield and shutter electrode means to provide a first set of electrode areas uniformly spaced circumferentially around said axis for sensing charges from the electric field, said shutter electrode means having a second set of open areas alternating around its axis with field intercepting electrode portions thereof to alternately expose and cover sensing areas of said first set, the areas of one of said first and second sets being each circular and the areas of the other of said first and second sets extending between lines extending radially perpendicular to said axis, said shield electrode means including a cup-shaped conducting member having an outwardly facing flat wall with a set of apertures therein, said sensing electrode areas being on a flat disk extending parallel to said flat wall and being defined by said set of apertures which define a mask for said flat disk.

41. A sensor according to claim 40 wherein there are four such areas in at least one of said sets.

42. A sensor according to claim 40 wherein said shutter electrode is located at the outer side of said flat wall.

43. A sensor according to claim 40 wherein said shutter electrode is located within said cup-shaped member between said flat wall and said flat disk.

* * * * *